United States Patent [19]
Nagate et al.

[11] Patent Number: 5,772,839
[45] Date of Patent: Jun. 30, 1998

[54] FILM APPLYING APPARATUS

[75] Inventors: Hiroshi Nagate, Fujinomiya; Yoji Washizaki, Tokyo, both of Japan

[73] Assignees: Fuji Photo Film Co., Ltd., Minami-Ashigara; Somar Corporation, Tokyo, both of Japan

[21] Appl. No.: 591,400

[22] Filed: Jan. 25, 1996

[30] Foreign Application Priority Data

Feb. 3, 1995 [JP] Japan .................................. 7-017080
Jun. 30, 1995 [JP] Japan .................................. 7-165198

[51] Int. Cl.⁶ .......................... B32B 31/00; G03C 1/805
[52] U.S. Cl. ........................ 156/522; 156/584; 156/519; 156/521; 156/552; 156/556; 156/566; 156/555
[58] Field of Search .................................. 156/521, 552, 156/556, 566, 584, 555, 344, 522, 519; 226/198, 195, 118; 83/886, 881, 582, 614

[56] References Cited

U.S. PATENT DOCUMENTS

| | | | |
|---|---|---|---|
| 3,277,760 | 10/1966 | Keene et al. | 83/614 |
| 3,360,174 | 12/1967 | Evert | 226/198 |
| 3,623,388 | 11/1971 | Gottling et al. | 83/582 |
| 4,880,488 | 11/1989 | Matsuo et al. | 156/344 |
| 5,053,099 | 10/1991 | Seki et al. | 156/250 |
| 5,106,450 | 4/1992 | Freisitzer et al. | 156/517 |
| 5,431,077 | 7/1995 | Murakami | 83/614 |
| 5,437,960 | 8/1995 | Nagate et al. | 430/256 |

FOREIGN PATENT DOCUMENTS

| | | | |
|---|---|---|---|
| A-0-330-339 | 8/1989 | European Pat. Off. | 156/517 |
| A-33-39-723 | 5/1985 | Germany | 166/517 |
| A-7-209878 | 8/1995 | Japan | 156/517 |

*Primary Examiner*—David A. Simmons
*Assistant Examiner*—Linda L. Gray
*Attorney, Agent, or Firm*—Oliff & Berridge, PLC

[57] ABSTRACT

A film applying apparatus includes a presser roll reciprocally movable toward and away from the leading end portion of a tacking member to force an adhesive tape against a cover film of the laminated film while the laminated film is held by suction on a surface at the leading end portion of the tacking member. The surface of the tacking member includes a first and a second beveled surface. When the presser roll is advanced by a presser roll actuating device, it rolls on from the first beveled surface to a leading end of the second beveled surface during which time the adhesive tape is firmly adhered to the cover film. Then the presser roll is retracted and, at the same time, the adhesive tape is pulled by an adhesive-tape pullback device in a direction away from the tacking member whereupon the cover film adhered to the adhesive tape is separated from the laminated film. After the tacking is completed, a film tensioning device is driven to pull the laminated film backward. In this instance, since a slackening device is activated to slack the adhesive tape and the cover film adhered thereto, the laminated film can be readily pulled backward.

10 Claims, 16 Drawing Sheets

FILM APPLYING APPARATUS

BACKGROUND OF THE INVENTION

1. Field of the Invention

This invention relates to a method and apparatus for applying a film to the surface of a base plate for a printed circuit board, for example.

2. Description of the Related Art

A process for the manufacture of printed circuit boards used for electronic equipment such as computers includes a step of applying a laminated film to the surface of a base plate for the printed circuit board.

A film applying apparatus used for applying the laminated film is constructed such that a continuous film wound on a film supply roll is guided via guide rolls to a leading end of a base plate while being conveyed by a conveying means, then tacked by a tacking member to the leading end of the base plate, and thereafter applied to the base plate under pressure by a lamination roll while conveyance of the base plate is further continued.

One such film applying apparatus is described, for example, in Japanese Patent Application Laid-open No. Hei 7-209878 as a photosensitive layer laminating apparatus which includes a mechanism for separating, by means of an adhesive tape, a protective film (cover film) from the leading end of a film having an photosensitive layer covered with the protective film, a pair of opposed thermocompression laminating rolls for advancing the film having the photosensitive layer and a base plate while gripping and thereby bonding them with pressure and heat, and a mechanism for cutting the protective film and the photosensitive layer on the film. The laminating apparatus further includes an adhesive tape roll drivable by the protective film separating mechanism to achieve a take-up operation, a retractable presser bar for forcing the adhesive tape against a leading end of the protective film, a dancer roll for adjusting the length of a path of the adhesive tape, and a protective-film recovery roll for taking up the adhesive tape through a surface friction drive by a delivery roll for the film having the protective film.

The presser bar has a front edge shaped to form an acute angle and forces the adhesive tape to a leading end of the protective film during which time it pulls the adhesive tape to stretch a length of the adhesive film stored by the dancer roll.

The mechanism for cutting the protective film and the photosensitive layer on the film includes a round cutter (disk cutter) adapted to be forced against the protective film and movable in the widthwise direction of the film.

The adhesive tape is normally set at two positions spaced in the widthwise direction of the film. The presser bar is pivotally movable within a fixed angular range and moved back and forth by an air cylinder. The air cylinder is provided by way of a pair of air cylinders disposed in tandem relation in the widthwise direction of the film and driven in synchronism with each other.

As described above, the presser bar is reciprocated by the two laterally spaced synchronously driven air cylinders. Accordingly, if an adjustment due for establishing a uniform distribution of contact force throughout the width of the presser bar is difficult to achieve, the prior apparatus encounters a problem that due to irregular distribution of the contact force, one of the adhesive tapes bonded to the protective film fails to peel off or separate the protective film.

To deal with this problem, an attempt may be made to increase the contact pressure of the presser bar which is generated by the air cylinders. However, an excessively large contact pressure would damage the lamination film. Another problem is that since the dancer roll for adjusting the path length of the adhesive tape is provided separately from the presser bar and pivotally movable within a relatively large angular range, a relatively large space should be reserved in the apparatus for installation and operation of the dancer roll.

The cutting mechanism including the round cutter forces the round cutter against the film to partly cut the thickness of the film while the film is held on a cutter backup plate. The round cutter is likely to be nicked or otherwise damaged due to an impact force exerted thereon when the round cutter impinges on a corner edge of the cutter backup plate as it runs onto the cutter backup plate. A frequent replacement of the round cutter is needed, accordingly.

In the case of a general film applying apparatus, the tacking member has a heater disposed at a leading end of the tacking member for heating a leading end of the film to tack the film to the leading end of the base plate. Thereafter, the film is bonded to the base plate under pressure by lamination rolls while the base plate is continuously conveyed. The tacking member having completed tacking of the film to the leading end of the base plate moves in a direction away from the base plate, and a negative pressure or vacuum for attracting the film is ceased whereupon a tension roll disposed upstream of the tacking member is pulled by a spring in a direction to stretch a portion of the film located near the base plate.

In the case of the foregoing film applying apparatus wherein the protective film is separated by the presser bar, the protective film adhering to the adhesive tapes on the presser bar hinders backward movement of the film having the photosensitive layer with the result that a slack on the film created immediately after the tacking cannot be reduced. Under such condition, if the slack film is pressure-bonded to the base plate by the lamination rolls, the bonded film involves generation of wrinkles or bubbles are trapped between the film and the base plate.

Furthermore, heat generated from the heater at the leading end of the tacking member is transmitted to a main vacuum plate thereof, thereby heating the film even when a heat insulating material is disposed between the main vacuum plate and the leading end of the tacking member.

Accordingly, when radiation of heat from the main vacuum plate is insufficient, the laminated film is heated up to a high temperature. Particularly, in the case where the light-transmissible support film layer is thin and has a thickness not greater than 50 $\mu$m, certain problems would occur as described below. (1) The photosensitive resin layer is influenced by heat while the film is held in contact with the front face of the tacking member during the film supplying and tacking operation. On the other hand, during the pressure-bonding operation, the film is held out of contact with the front face of the tacking member with the result that the photosensitive resin layer is not influenced by heat from the heater. Thus, due to the difference in heat history afforded to the photosensitive resin layer at the foregoing two operations, a wiring pattern formed on the base plate after exposure and development processes may contain a defect. (2) Since the laminated film becomes soft at a high temperature, these parts of the laminated film, which are located in front of the suction holes and suction grooves in the main vacuum plate, are bent or flexed by the action of a vacuum or suction and form recessed portions arranged in the same pattern as the suction holes and suction grooves. As a result of formation of the recessed portions, the photosensitive resin layer is not uniform in thickness.

If the laminated film having such recessed portions and carrying thereon the photosensitive resin layer of varying thickness is applied to the base plate, it occurs likely that due to irregularities in thickness of the photosensitive resin layer on the base plate, a wiring pattern formed on the base plate after the exposure and development processes includes a defect, such as an intrusion, a mouse nip or a break.

This phenomenon becomes remarkable when the laminated film is sucked on the main vacuum plate with the cover plate removed. The same still occurs even when the cover film is not removed.

According to the film applying apparatus described in Japanese Patent Application Laid-open No. Hei 7-209878 specified above, since the cover film (protective film) is separated at a position downstream of the main vacuum plate (between the tacking member and the base plate), the photosensitive resin layer is rendered instable in viscosity by the effect of heat applied thereto. In addition to those (1) and (2) enumerated in the preceding paragraph, another problem caused from the instable viscosity is that even when the cover film is peeled off from the photosensitive resin layer under a constant pulling force, a peeling point frequently shafts or fluctuates, thereby producing a number of transverse lines or marks formed on the photosensitive resin layer at varying intervals in the feed direction of the film.

Like the difference in heat history afforded to the photosensitive resin layer and nonuniform thickness of the photosensitive resin layer originated from the recessed portions in the laminated film, the lines thus formed results in an irregular bonding thickness or nonuniform bonding between the photosensitive layer and the base plate. Eventually, the foregoing deficiencies results in a development failure appearing on a wiring pattern in the form of a intrusion, a mouse nip or a break.

SUMMARY OF THE INVENTION

With the foregoing drawbacks in view, it is an object of the present invention to provide a film applying method and an apparatus for carrying out the same, which are capable of achieving a reliable separation of a cover film.

Another object of the present invention is to provide a film applying method and an apparatus for carrying out the same, which are capable of reducing a slack on a film after a leading end of the film is tacked to a base plate, thereby ensuring that the film can be pressure-bonded to the base plate by lamination rolls without producing wrinkles on the tape or bubbles trapped between the film and the base plate.

A further object of the present invention is to provide a film applying apparatus which is capable of achieving a reliable cutting operation without damaging the edge of a round or disk cutter, thereby extending the service life of the disk cutter.

Another object of the present invention is to provide a film applying method and an apparatus for carrying out the same, which are capable of reducing the size of, and simplifying the construction of, a mechanism required for adjusting the length of a path for an adhesive tape when a cover film is peeled by using the adhesive film.

A still further object of the present invention is to provide a film applying apparatus which is capable of reducing the influence of heat transmitted from the main vacuum plate to the laminated film, thereby ensuring that even when the cover film is peeled at a position between a tacking member and a base plate, the laminated film can be neatly bonded to the base plate without involving a difference in heat history afforded to the photosensitive resin layer, irregularities in thickness of the photosensitive resin layer, or lines formed on the photosensitive resin layer which would otherwise result in a development failure appearing on a wiring pattern in the form of an intrusion, a mouse nip or a break.

In one aspect the present invention provides a film applying method of the type wherein a continuous laminated film wound on a film supply roll and composed at least of a base film, a photosensitive layer and a cover film laminated one above another passes through a tension roll, then is guided by a tacking member to a leading end of a base plate while being conveyed by a conveying means, subsequently is tacked to the leading end of the base plate, with the cover film peeled from the photosensitive layer, and thereafter is applied to the base plate under pressure by lamination rolls while conveyance of the base plate is further continued, and wherein the tacking member has, at its base plate side, a leading end portion including a vertical surface extending along a path of the laminated film, a first beveled surface extending obliquely from a leading end of the vertical surface in a direction away from the path, a second beveled surface extending obliquely from a leading end of the first beveled surface in a direction away from the path, and suction holes for holding the laminated film by suction on the vertical surface, the first beveled surface and the second beveled surface, characterized by: cutting the cover film and the photosensitive layer in the widthwise direction of the laminated film at a position upstream of the tacking member, with the base film left uncut, while the laminated film is held by suction on the tacking member; guiding an adhesive tape around a presser roll extending in the widthwise direction of the laminated film, with an adhesive side of the adhesive tape facing outward, then forcing the presser roll against the leading end portion of the tacking member to cause the presser roll to roll on from the first beveled surface to a leading end of the second beveled surface to thereby force the adhesive tape into adhesion with the cover film, and thereafter moving the presser roll in a direction away from the position of the leading end of the second beveled surface; pulling the adhesive tape in a direction away from the first and second beveled surfaces in synchronism with the movement of the presser roll when the presser roll moves in the direction away from the second beveled surface; and taking up the adhesive tape and a portion of the cover film bonded to the adhesive tape and peeled from the photosensitive layer on the base film as the adhesive tape is pulled in the direction away from the first and second beveled surfaces.

Since the leading end portion of the tacking member includes a vertical surface extending along the film path, a first beveled surface and a second beveled surface contiguous with each other, and since the presser roll runs on from the first beveled surface to the leading end of the second beveled surface to force the adhesive tape into adhesion with the cover film of the laminated film while being held by suction on the leading end portion of the tacking member, the adhesive tape is firmly attached by adhesion to the cover film and hence can separate or peel off the cover film with sufficient reliability when the adhesive tape is pulled away from the leading end portion of the tacking member.

In a preferred form of the invention, the tension roll is urged by a spring via a pivot arm in such a direction as to pull the laminated film backward, and after the laminated film is tacked to the leading end of the base plate by the tacking member, and for at least a part of a time period between the start of movement of the tacking member in a direction away from the base plate and the start of pressure-bonding of the laminated film by the lamination rolls, the tension roll is driven in a laminated-film tensioning direction to pull the laminated film backward by a predetermined distance, the driving of the tension roll being released before the start of pressure-bonding of the laminated film by the lamination rolls.

The laminated film with cover film peeled is tacked to at its leading end to the base plate by the tacking member, and after the tacking member is separated from the base plate, the tension roll pulls the laminated film backward to cancel out or reduce a slack on the laminated film. The laminated film thus stretched can be applied to the base plate under pressure by the lamination rolls with no wrinkle formed on the laminated film or no bubble trapped between the lamination film and the base plate.

It is preferable that subsequent to the start of movement of the tacking member in the direction away from the base plate, and before or simultaneously with the start of pulling back of the laminated film, the cover film and the adhesive tape bonded thereto are slackened at a portion extending between the presser roll and a cover film take-up means.

Since a slack is provided on the adhesive tape and the cover film either simultaneously with, or in advance to an operation of the tension roll to stretch the laminated film, the laminated film stretching operation can be achieved smoothly.

Preferably, a dancer roll is disposed between the presser roll and the cover film take-up means and urged by a spring to pull the cover film and the adhesive tape in a direction toward the cover film take-up means, the dancer roll being forced in a direction toward the presser roll to thereby slacken the portion of the adhesive tape and the cover film.

The adhesive tape and the cover film adhered thereto can be readily slackened when the dancer roll is forced toward the presser roll.

In another aspect the present invention provides a film applying apparatus of the type wherein a continuous laminated film wound on a film supply roll and composed at least of a base film, a photosensitive layer and a cover film laminated one above another is guided via guide rolls to a leading end of a base plate while being conveyed by a conveying means, then tacked by a tacking member to the leading end of the base plate with the cover film peeled from the photosensitive layer, and thereafter applied to the base plate under pressure by lamination rolls while conveyance of the base plate is further continued, characterized by comprising: the tacking member having, at its base plate side, a leading end portion including a vertical surface extending along a path of the laminated film, a first beveled surface extending obliquely from a leading end of the vertical surface in a direction away from the path, a second beveled surface extending obliquely from a leading end of the first beveled surface in a direction away from the path, and suction holes formed in the vertical surface, the first beveled surface and the second beveled surface for holding the laminated film by suction on these surfaces; a half-cut device disposed upstream of the tacking member and movable in the widthwise direction of the laminated film for cutting the cover film and the photosensitive layer, with the base film left uncut; an adhesive tape supplying device disposed adjacent to the tacking member for supplying an adhesive tape in the direction of movement of the laminated film while keeping the adhesive tape in substantially confronted relation to the laminated film; a presser roll extending in the widthwise direction of the laminated film and rollingly engageable with the first and second beveled surfaces of the leading end portion of the tacking member, the presser roll guiding therearound the adhesive tape with its adhesive side facing outward; a presser roll actuating device rotatably supporting thereon the presser roll and operable to force the presser roll against the leading end portion of the tacking member to cause the presser roll to roll on from the first beveled surface to a leading end of the second beveled surface to thereby force the adhesive tape into adhesion with the cover film, the presser roll actuating device being also operable to move the presser roll in a direction away from the position of the leading end of the second beveled surface; adhesive-tape pullback means for pulling the adhesive tape in a direction away from the first and second beveled surfaces in synchronism with the movement of the presser roll when the presser roll is moved in a direction away from the second beveled surface; and a film-and-tape take-up device for taking up the adhesive tape and a portion of the cover film bonded to the adhesive tape and separated from the photosensitive layer on the base film as the adhesive tape is pulled in the direction away from the first and second beveled surfaces.

The tacking member has a leading end portion including a vertical surface extending along the film path, a first beveled surface and a second beveled surface contiguous with each other. The presser roll is forced against the leading end portion of the tacking member and rolls on from the first beveled surface to the leading end of the second beveled surface during which time the adhesive tape is forced into adhesion with the cover film of a laminated film held by suction on the leading end portion of the tacking member. The adhesive tape is firmly attached by adhesion to the cover tape and, hence, when the tape pullback means is activated, the adhesive tape can separate or peel off the cover film with reliability.

It is preferable that the guide roll is composed of a tension roll urged by a spring via a pivot arm in such a direction as to pull the laminated film backward, the tension roll and the pivot arm constituting a laminated film tensioning mechanism, and that a film tensioning device is disposed to secure engagement with the laminated film tensioning mechanism and engageable with the laminated film tensioning mechanism to force the tension roll in a direction to tension the laminated film by a predetermined distance for at least a part of a time period between the start of movement of the tacking member in a direction away from the base plate and the start of pressure-bonding of the laminated film by the lamination rolls after the laminated film is tacked by the tacking member to the leading end of the base plate, with the cover film separated from the laminated film.

The leading end of the laminated film which is devoid of the cover film is tacked to the base plate by the tacking member, and after the tacking member is moved in a direction away from the base plate, the tension roll pulls the laminated film backward to cancel out or reduce a slack on the laminated film. The laminated film thus stretched can be neatly press-bonded to the base plate by the lamination rolls without generating wrinkles on the laminated film or bubbles trapped between the lamination film and the base plate.

In a preferred embodiment, a slackening device is disposed for slackening the adhesive tape and the cover film bonded thereto at a portion extending between the presser roll and the film-and-tape take-up device at a time subsequent to the start of movement of the tacking member in the direction away from the base plate, and before or simultaneously with the start of tensioning of the laminated film by the film tensioning device The adhesive tape and the cover film adhered thereto are slackened by the slackening device at the same time as or before the tension roll is driven to pull the laminated film backward. By virtue of a slack on the to adhesive tape and the cover film, the tension roll can readily stretch the laminated film.

The slackening device is preferably composed of a pushing device disposed between a dancer roll of the adhesive-tape pullback means and the presser roll actuating device and operative to force the dancer roll relative to the presser roll actuating device and in a direction toward the presser roll.

The dancer roll can be positively displaced toward the laminated film by the pushing device which is disposed between the presser roll actuating device and the dancer roll.

Preferably, the adhesive-tape pullback means includes a guide shaft so provided as to project toward the slackening device and movable back and forth in unison with the presser roll, and a bearing member slidably supported on the guide shaft and urged by a film pullback spring in a direction away from the presser roll, the bearing member rotatably supporting thereon the dancer roll. The pushing device preferably comprises a cylinder device including a cylinder and a rod, one of the cylinder and the rod being connected to the guide shaft and the other of the cylinder and the rod being connected to the bearing member.

The pushing cylinder constituting the pushing device is disposed between the guide shaft and the bearing member on which the dancer roll is supported, so that the dancer roll can be positively displaced by the pushing cylinder.

The film tensioning device preferably has a construction such that after it moves the tension roll in the direction to tension the laminated film by the predetermined distance, the film tensioning device is returned to a standby position.

The film tensioning device forces the tension roll in a direction to stretch the laminated film and, thereafter, this device is returned to the standby position. With this arrangement, when the laminated film is subjected to an undue tension, the tension roll is displaceable in a direction to absorb the tension thus applied.

Preferably, the adhesive-tape pullback means comprises a dancer roll mounted on the presser roll actuating device in parallel relation to the presser roll and movable in the direction of reciprocation of the presser roll while the adhesive tape and the cover film separated by the adhesive tape are wound around the dancer roll at a position between the presser roll and the film-and-tape take-up device, and a film pullback spring urging the dancer roll in a direction of retracting movement of the presser roll and having a spring force which is set to allow the film pull-back spring to deform into an axially contracted shape by a tension applied to the adhesive tape when the presser roll is advanced by the presser roll actuating device.

The dancer roll is preferably mounted on the presser roll actuating device and hence requires only a small space for installation.

When the presser roll forces the adhesive tape to the cover film, the dancer roll is displaced toward the presser roll actuating device against the force of the spring disposed therebetween. With this movement of the dancer roll, a length of the adhesive tape stored by the dancer roll is pulled back and adhered to the cover film. When the presser roll is retracted in a direction to separate the cover film, the spring is allowed to extend, thereby take up a slack on the adhesive tape created when the cover film is separated.

The film pullback spring of the adhesive-tape pullback means preferably has a spring constant greater than that of the spring urging the pivot arm.

Owing to the film pullback spring having a greater spring constant than the spring used to urge the pivot arm, the adhesive tape and the cover film adhered thereto is kept immovable by the film pullback spring against displacement toward the lamination roll when the tension roll supported on the pivot arm is oscillated against the force of the associated spring as the laminated film is applied to the base plate under pressure by the lamination rolls. Accordingly, the cover film can be separated or peeled off with sufficient reliability.

In a preferred embodiment, the presser roll actuating device comprises a support shaft disposed in parallel spaced relation to the presser roll, an adjustment frame supported on the support shaft substantially at a longitudinal central portion of the latter, a support frame pivotally mounted on the support shaft at a position adjacent to the adjustment frame and pivotally movable about an axis of the support shaft and further extending along and over the support shaft, a pair of linear shafts reciprocally mounted on opposite longitudinal end portions of the support frame and movable toward and away from the first beveled surface and further rotatably supporting at their front end the presser roll, an actuator for reciprocating the linear shafts in the axial direction thereof, and a roll-urging spring disposed between the adjustment frame and the support frame and urging the support frame to move relative to the adjustment frame in a direction to secure pressure contact of the presser roll relative to the first and second beveled surfaces.

Since the support frame supporting the presser roll via a pair of the linear shafts is mounted substantially at a longitudinal central portion of the support shaft extending parallel to the presser roll, the contact pressure exerted from the presser roll to the cover film can be readily adjusted uniformly throughout the width of the presser roll. With this uniform distribution of the contact pressure, the cover film can be separated smoothly and stably.

The half-cut device preferably comprises a disk cutter rotatable in a plane perpendicular to the laminated film and reciprocally movable in the widthwise direction of the laminated film, and a pair of guide rolls disposed in juxtaposition on opposite sides of the disk cutter as viewed from the direction of movement of the disk cutter and rotatable in a plane parallel to a plane of rotation of the disk cutter. The guide rolls have peripheral surfaces jointly defining a common tangent plane facing the laminated film, the common tangent plane being substantially tangent to a cutting edge of the disk cutter.

The guide rolls disposed in front and in the rear of the disk cutter as viewed from the direction of movement of the disk cutter and having the same position as the cutting edge of the disk cutter as viewed from the direction of the thickness of the laminated film, are always held in contact with the cover film and continuously force the laminated film against the cutter backup plate. The disk cutter is retracted when the front or leading guide roll runs on an edge of the cutter backup plate, so that there is no risk of breaking or otherwise damaging the cutting edge of the disk cutter due to collision with the cutter backup plate edge. Thus, the disk cutter has a prolonged service life.

It is preferable that the half-cut device further includes a transverse drive unit having a guide member extending in the widthwise direction of the laminated film, a slide member supported by the transverse drive unit and driven by the latter to reciprocate in the widthwise direction of the laminated film along the guide member, the slide member supporting thereon the guide rolls, a movable member supporting thereon the disk cutter and supported by the slide member such that the movable member is reciprocally movable in the widthwise direction of the laminated film within a predetermined range of distance, a spring acting between the movable member and the slide member to urge the movable member toward the laminated film, and spring adjustment means for adjusting a set length of the spring.

The disk cutter is urged by the spring to displace relative to the slide member in a direction toward the laminated film, while the guide rolls are fixedly supported on the slide member. The guide rolls stably force the laminated film against the cutter backup plate. When the disk cutter impinges on the edge of the cutter backup plate, the disk cutter is retractable against the force of the spring to take up an impact force applied thereto.

The slide member is reciprocally movable toward and away from the laminated film and hence can follow surface irregularities on the laminated film. Another advantage is that the cutting pressure can readily be adjusted via an adjustment of the set length of the spring.

In one preferred form, the film applying apparatus further includes a cutter backup plate made of a rigid material and disposed at a position opposite to a path of movement of the disk cutter across the laminated film for pressure contact with the disk cutter when the disk cutter is forced against the backup plate through the thickness of the laminated film.

The cutter backup plate disposed on the opposite side of the disk cutter across the laminated film is made of a rigid material such as rigid plastic or metal. With this cutter backup plate, the disk cutter is able to perform a precision cutting operation in which the cutting edge bites the laminated film with a desired cutting depth which is equal to the thickness of the cover film, for example, while the laminated film is held stable against displacement and distortion.

It is preferable that the transverse drive unit and the cutter backup plate are supported on a single unit frame.

A unitary construction provided between the transverse drive unit and cutter backup plate via the unit frame facilitates an assembling process and ensues a reliable holding of the laminated film during severing operation.

The tacking member preferably includes a main vacuum plate having the vertical surface, and a film-tacking member body connected to a leading end, as viewed in the direction of feed of the laminated film, of the main vacuum plate and having the first and second beveled surfaces, the film-tacking member body having a heater embedded therein in the vicinity of a leading end as viewed in the direction of feed of the laminated film, and a fluid passage hole formed in and extending through the main vacuum plate body and disposed in parallel with the vertical surface for the passage therethrough of a cooling fluid.

The main vacuum plate cooled by the cooling fluid and does not reach a high temperature. Accordingly, the laminated film is not subjected to high temperatures while it is held by suction on the main vacuum plate as the laminated film is tacked by the tacking member to the base plate. Accordingly, the photosensitive resin layer of the laminated film is free from thermal deformation, has a uniform heat history, is highly stable in viscosity with the result that a wiring pattern formed on the base plate after the exposure and development processes is completely free from a development failure appearing in the form of an intrusion, a mouse nip or a break.

Preferably, the film-tacking member body has formed therein a second fluid passage hole extending through the film-tacking member body and disposed in parallel with the first and second beveled surfaces for the passage therethrough of the cooling fluid.

With this arrangement, transmission of heat from the heater to the main vacuum plate is limited to a great extent by the cooling fluid flowing through the film-tacking member body. Due to such limited heat transmission, the main vacuum plate and the laminated film attracted thereto do not encounter undue temperature rise.

In another preferred embodiment, the film applying apparatus further includes at least one cooling roll disposed on the path of the laminated film adjacent the tacking member and rollingly engageable with the laminated film from the opposite side of the tacking member, the cooling roll having a third fluid passage hole extending longitudinally therethrough for the passage of the cooling fluid.

By virtue of the cooling roll provided on the opposite side of the tacking member across the laminated film, the laminated film is cooled on its opposite sides and hence is substantially independent of a rise in temperature.

The fluid passage hole and the second fluid passage to hole are preferably defined by a pair of stainless steel pipes disposed in and extending through the main vacuum plate and the film-tacking member body, respectively.

Since the cooling fluid is held out of direct contact with the material of the main vacuum plate and the film-tacking member body, the main vacuum plate and the film-tacking member body are free from corrosion problems. These plates can, therefore, be formed by a material which has a smaller corrosion resistance than stainless steel and a greater heat conductivity than the stainless steel, such as anodized aluminum.

The above and other objects, advantages and features of the present invention will become manifest to those versed in the art upon making reference to the detailed description and the accompanying sheets of drawings in which preferred structural embodiments incorporating the principles of the present invention are shown by way of illustrative example.

DETAILED DESCRIPTION OF THE PREFERRED EMBODIMENTS

Certain preferred embodiments of the present invention will be described blow in greater detail with reference to the accompanying drawings.

Figure 1:
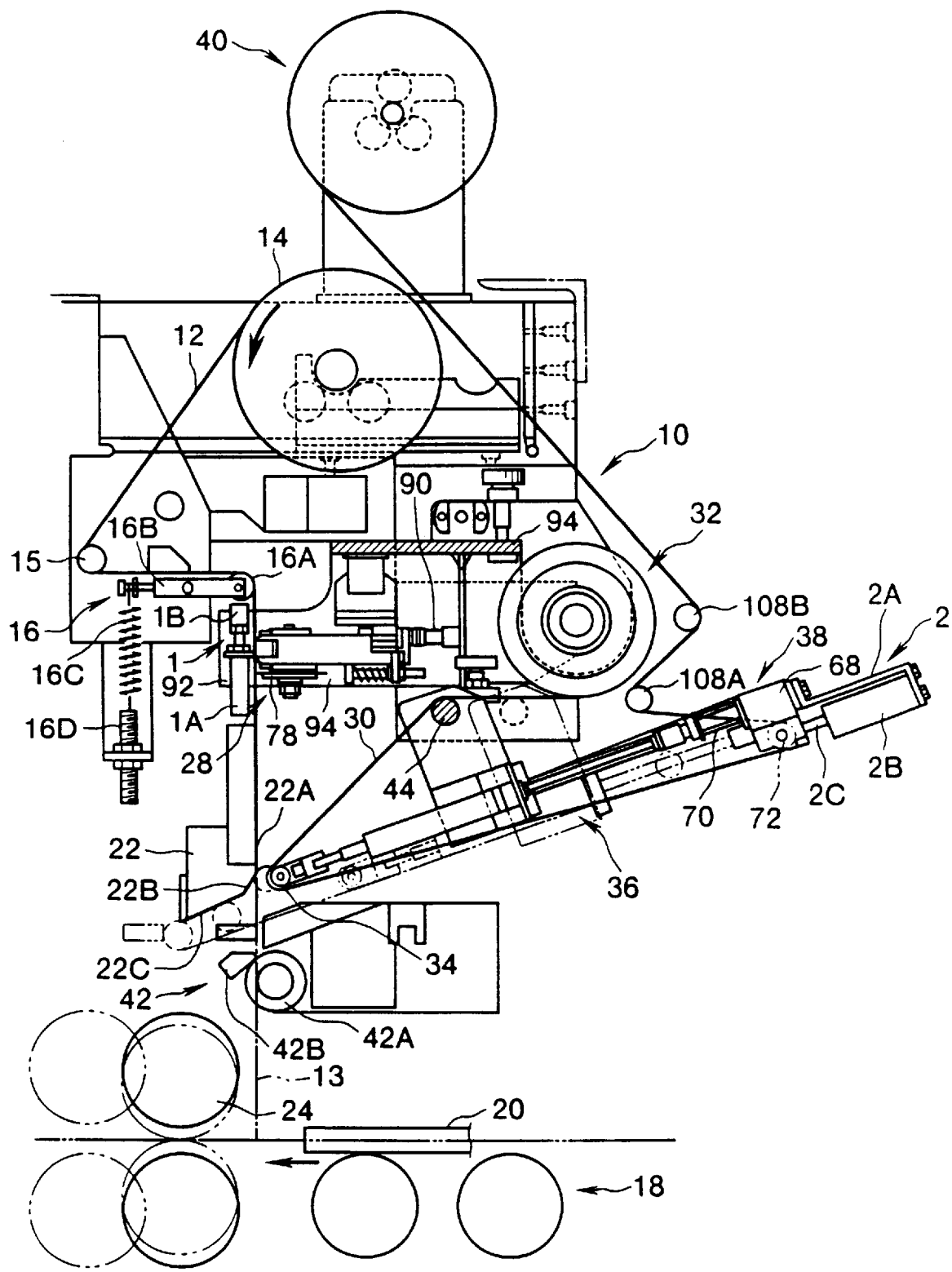
FIG. 1 is a diagrammatical side view, partly in cross section, of a film applying apparatus according to an embodiment of the present invention.

FIG. 1 shows a film applying apparatus 10 according to one preferred embodiment of the present invention. The film applying apparatus 10 is constructed such that a laminated film 12 composed of a base film 12A, a photosensitive layer 12B and a cover film 12C laminated one above another is guided from a film supply roll 14 via a guide roll 15 and a tension roll 16A of a film tensioning mechanism 16 to the vicinity of a leading end of a base plate 20 while being conveyed by a conveying means 18 composed of conveyor rolls, then tacked by a tacking member 22 to the vicinity of the leading end of the base plate 20, with the cover film 12C separated from the photosensitive layer 12B, and thereafter applied to the base plate 20 under pressure by lamination rolls 24 while conveyance of the base plate 20 is further continued.

For a period of time between the end of tacking of the laminated film 12 to the base plate 20 by the tacking member 22 and the start of pressure-bonding of the laminated film 12 to the base plate 20 by the lamination rolls 24, the laminated film 12 is tensioned by a film tensioning device 1 to reduce a slack on the laminated film 12. As the laminated film 12 is tensioned by the film tensioning device 1, an adhesive tape 30 described later and a portion of the cover film 12C separated by being bonded with the adhesive tape 30 to are slackened by a slackening device 2 to facilitate tensioning of the film by the film tensioning device 1.

The tacking member 22 has, at its base plate 20 side, a leading end portion including a vertical surface 22A extending along a path 13 of feed of the laminated film 12, a first beveled surface 22B extending obliquely from a leading end of the vertical surface 22A in a direction away from the path 13, and a second beveled surface 22C extending obliquely from a leading end of the first beveled surface 22B in a direction away from the path 13. The tacking member 22 further has film suction grooves 23A and 25A (FIG. 9) formed in the vertical surface 22A and the first and second beveled surfaces 22B, 22C for holding the laminated film 12 by suction on the above surfaces 22A–22C.

A half-cut device 28 is disposed upstream of the tacking member 22 and movable on the path 13 of the laminated film 12 in the widthwise or transverse direction of the laminated film 12 for cutting or severing the cover film 12C and the photosensitive layer 12B of the laminated film 12, with the base film 12A left uncut.

An adhesive tape supplying device 32 is disposed adjacent to the tacking member 22 for supplying an adhesive tape 30 in the direction of movement of the laminated film 12 in parallel relation to the laminated film 12. The adhesive tape supplying device 32 is located at a position close to each of the opposite longitudinal edges of the laminated film 12 so that two adhesive tapes 30 are supplied in confronted relation to the opposite longitudinal edges of the laminated film 12.

The adhesive tapes 30 supplied from the adhesive tape supplying devices 32 are wound around a presser roll 34 with its adhesive side facing outward. The presser roll 34 is disposed along the laminated film 12 in the widthwise direction of the same and rollingly engageable with the first and second beveled surfaces 22B and 22C of the tacking member 22. The presser roll 34 is rotatably supported by a presser roll actuating device 36.

The presser roll actuating device 36 is constructed such that the presser roll 34 forced by the presser roll actuating device 36 against the leading end of the tacking member 22 rolls on from the first beveled surface 22B to a leading end of the second beveled surface 22C to force the adhesive tapes 30 into adhesion with the cover film 12C of the laminated film 12 while being held by suction on the first and second beveled surfaces 22B and 22C. The presser roll actuating device 36 is also operable to retract or move the presser roll 34 away from the position of the leading end of the second beveled surface 22C.

The presser roll actuating device 36 is provided with an adhesive-tape pullback means 38 for pulling the adhesive tapes 30 in a direction away from the first and second beveled surfaces 22B and 22C in synchronism with the movement of the presser roll 34 when the presser roll 34 is retracted away from the second beveled surface 22C. The film applying apparatus 10 further includes a film-and-tape take-up device 40 disposed at an upper end of the film applying apparatus 10 for taking up the adhesive tapes 30 and that portion of the cover film 12C bonded with the adhesive tapes 30 and separated from the base film 12A and the photosensitive layer 12B as the adhesive tapes 30 are pulled in the direction away from the first and second beveled surfaces 22B and 22C.

In FIG. 1 reference character 42 denotes a rotary cutter composed of a rotary knife 42A and a stationary knife 42B cooperating to cut or sever the laminated film 12 lying on the path 13. The rotary knife 42A has a helical cutting edge provided on the periphery of a cylindrical shaft, and the stationary knife 42B has a straight cutting edge extending parallel to an axis of the cylindrical shaft of the rotary knife 42A.

Figure 2:
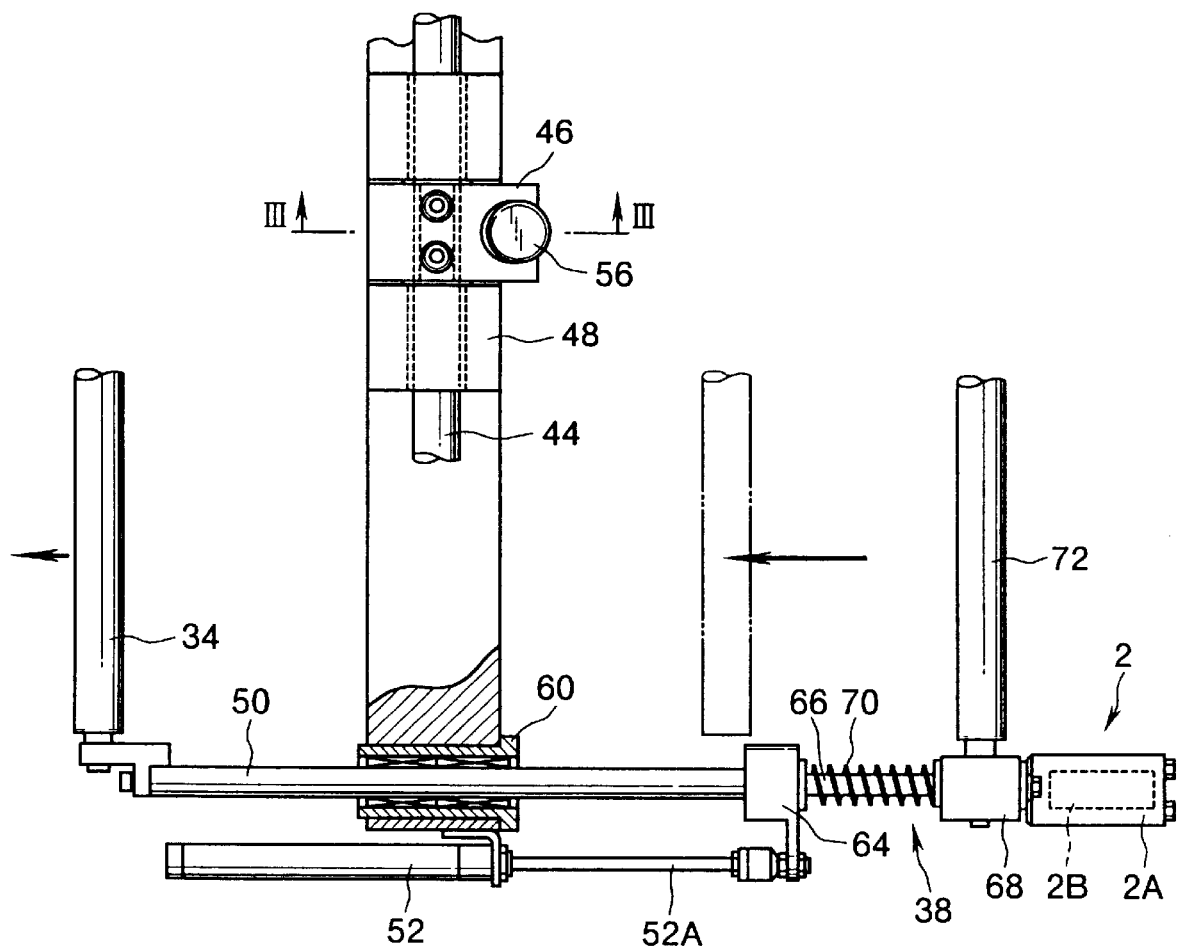
FIG. 2 is an enlarged plan view, partly in cross section, of a main portion of a presser roll actuating device in the same embodiment.
Figure 3:
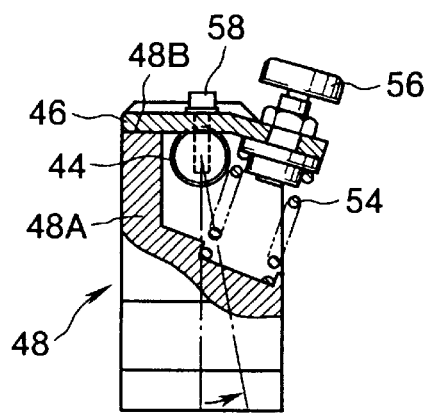
FIG. 3 is an enlarged cross-sectional view taken along the line III—III of FIG. 2.

The presser roll actuating device 36 comprises, as shown in FIG. 2, a support shaft 44 disposed in parallel relation to the presser roll 34 and having a circular cross section, an adjustment frame 46 supported on the support shaft 44 at a position confronting to a substantially widthwise central portion of the film path 13, a support frame 48 pivotally mounted on the support shaft 44 in such a manner as to surround opposite sides and the bottom of the adjustment frame 46 and pivotally movable about an axis of the support shaft 44, the support frame 48 extending in opposite directions along the support shaft 44, a pair of linear shafts (one being shown) 50 reciprocally mounted on opposite longitudinal end portions of the support frame 48 for reciprocating movement toward and away from the first beveled surface 22B and rotatably supporting at their front end the presser roll 34, a pair of actuators (one being shown) 52 for reciprocating the linear shafts 50 in the axial direction thereof, a roll-urging spring 54 disposed between the adjustment frame 46 and the support frame 48, as shown on enlarged scale in FIG. 3, and urging the support frame 48 relative to the adjustment frame 46 in such a direction that the presser roll 34 on the front end of the linear shafts 50 comes into pressure contact with the first and second beveled surfaces 22B and 22C. Reference character 56 shown in FIGS. 2 and 3 denotes an adjustment screw for adjusting a preset load on the roll-urging spring 54.

The adjustment frame 46 is fastened with a screw 58 to a flat cutout portion of the cylindrical support shaft 44 formed at a longitudinal central portion of an upper side of the support shaft 44.

The support frame 48 is arranged with the aid of the adjustment frame 46 and has a connecting portion 48A extending across a lower side of the adjustment frame 46, as shown in FIG. 3, and a stopper surface 48B defined by an upper end of the connecting portion 48A and held in abutment with the underside of the adjustment frame 46, as shown in FIG. 3. The support frame 48 urged by the roll-urging spring 54 to turn about an axis of the support shaft 44 in the clockwise direction in FIG. 3 is normally held in a forced or biased state or condition the stopper surface 48B abuts on the underside of the adjustment frame 46. The support frame 48 is pivotally movable in the counterclockwise direction in FIG. 3 against the force of the roll-urging spring 54 when it is subjected to a force greater than a predetermined value and tending to urge the support frame 48 in the counterclockwise direction.

The support frame 48 has a pair of bearings 60 disposed each at a portion located closer to a center of the support frame 48 than a portion on which a corresponding one of the actuators 52 is mounted. The linear shafts 50 mounted in parallel relation to the actuators 52 are slidably and axially reciprocally supported by the bearings 60. The linear shafts 50 each have an end opposite to the presser roll 34 and joined with a joint member 64 connected to an actuating portion 52A of the actuator 52.

The adhesive-tape pullback means 38 includes a pair of guide shafts (one being shown) 66 coaxial with the linear shafts 50 and projecting respectively from the joint members 64 in a direction away from the linear shafts 50, a pair of bearing members (one being shown) 68 slidably supported on the guide shafts 66, a pair of film pullback springs (one being shown) 70 urging the bearing members 68 in a direction away from the joint members 64, and a dancer roll 72 rotatably supported at its opposite ends in the londitudinal direction thereof by the bearing members 68. The guide shafts 66 are formed as an extension of each linear shaft 50 projecting from the joint member 64.

The film pullback springs 70 have a spring force which is set to allow the film pullback springs 70 to yield or deform into an axially contracted shape by a tension applied to the adhesive tapes 30 when the presser roll 34 is advanced by the presser roll actuating device 36.

The dancer roll 72 guides therearound a portion of the adhesive tapes 30 and the cover film 12C bonded thereto extending from the presser roll 34 to the film-and-tape take-up device 40.

The slackening device 2 includes a bracket 2A supported on an end portion of each guide shaft 66 projecting from the bearing member 68, and a pushing cylinder 2B composed of an air cylinder supported on the bracket 2A. The pushing cylinder 2B includes an actuating rod 2C having an outer end held in abutment with the bearing member 68 from the direction opposite to the film pullback spring 70.

The film tensioning device 1 includes a pair of lift-up cylinders 1A composed of air cylinders vertically disposed below the tension roll 16A, as shown in FIG. 1, and having a pair of actuating rods 1B, respectively, engageable with opposite end portions of a shaft of the tension roll 16A for lifting up the tension roll 16A.

The film tensioning mechanism 16 includes a pivot arm 16B rotatably supporting at its one end the tension roll 16A, and a spring 16C urging the opposite end of the pivot arm 16B downward in FIG. 1 to tension or stretch the laminated film 12 by the tension roll 16A. In FIG. 1, reference character 16D denotes an adjustment mechanism for adjusting a preset load on the spring 16C.

The film pullback springs 70 have a spring constant which is greater than the spring constant of the spring 16C of the film tensioning mechanism 16.

The presser roll 34 can be advanced by the pushing cylinders 2B to such an extent that the presser roll 34 does not reach the path 13 of the laminated film 12 even when it moved forward or advanced while the presser roll 34 is held in a standby state or condition after the cover film 12C is separated.

Figure 4:
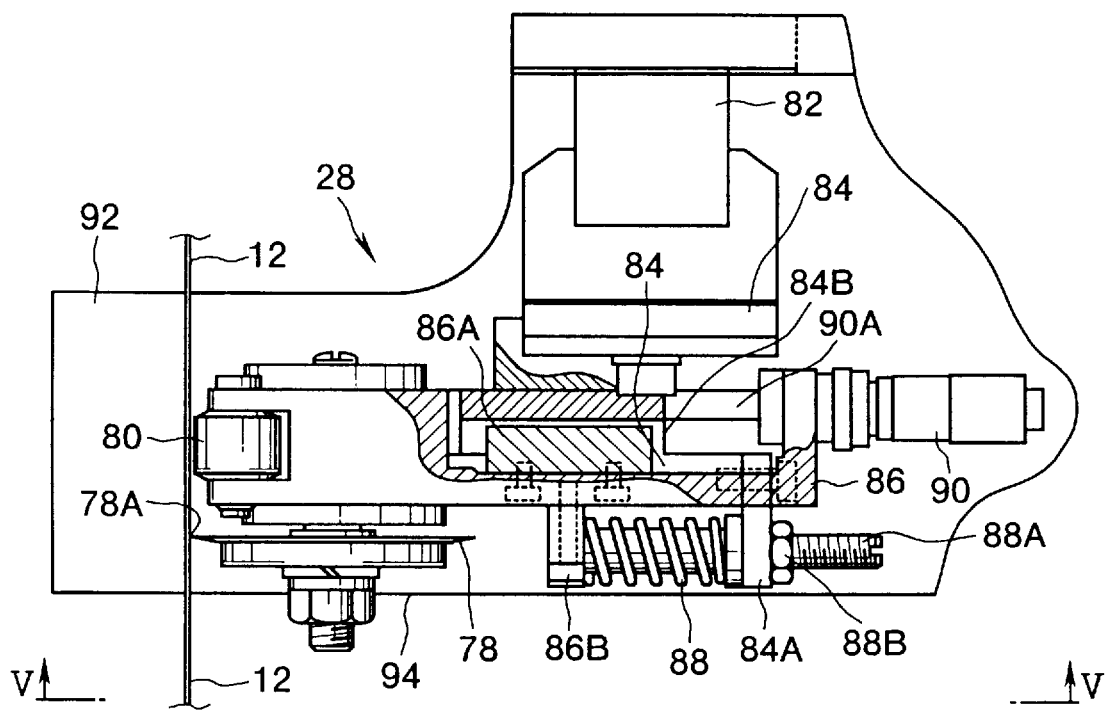
FIG. 4 is a side view, with parts in cross-section, of a half-cut device in the same embodiment.
Figure 5:
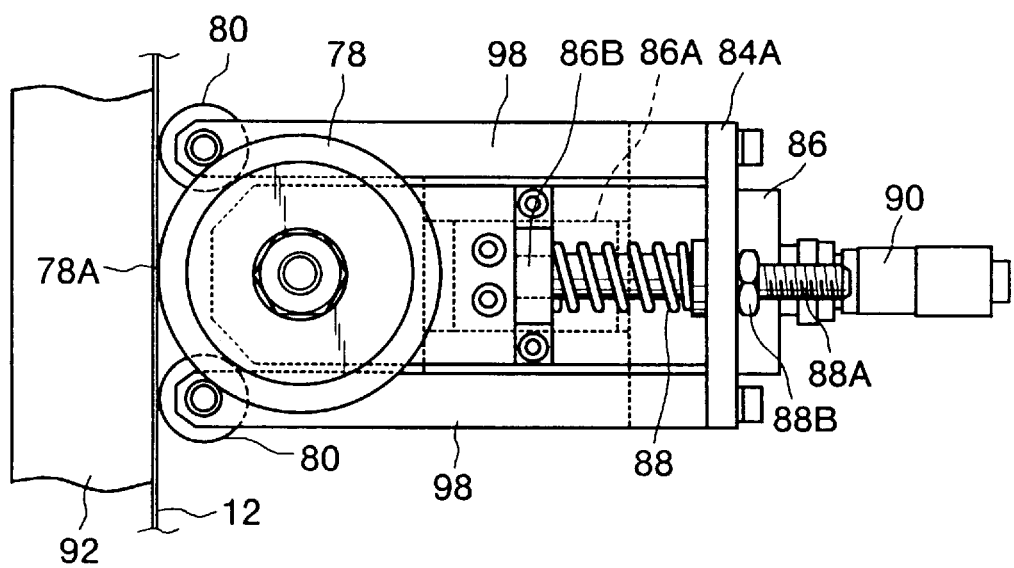
FIG. 5 is a cross-sectional view taken along the line V—V of FIG. 4.

The half-cut device 28, as shown on enlarged scale in FIGS. 4 and 5, comprises a disk cutter 78 rotatable in a plane perpendicular to the laminated film 12 and reciprocally movable in the widthwise direction of the laminated film 12, and a pair of guide rolls 80 disposed in juxtaposition on opposite sides of the disk cutter 78 as viewed from the direction of movement of the disk cutter 78 and rotatable in a plane parallel to a plane of rotation of the disk cutter 78. The guide rolls 80 have peripheral surfaces jointly defining a common tangent plane facing the laminated film, the common tangent plane being substantially tangent to a cutting edge 78A of the disk cutter 78.

The half-cut device 28 further includes a rodless cylinder 82 of the type having a built-in guide and disposed along the laminated film 12 in the widthwise direction of the same, a slide member 84 supported by the rod-less cylinder 82 and reciprocally movable by the rod-less cylinder 82 in the widthwise direction of the laminated film 12, the slide member 84 supporting thereon the guide rolls 80, a movable member 86 supporting thereon the disk cutter 78 and supported by the slide member 84 such that the movable member 86 is reciprocally movable in the widthwise direction of the laminated film 12 within a predetermined range of distance, a spring 88 acting between the movable member 86 and the slide member 84 to urge the movable member 86 toward the laminated film 12, and a micrometer 90 acting as a spring adjustment means for adjusting a set length of the spring 88.

The half-cut device 28 further includes a cutter backup plate 92 made of metal or rigid plastic and disposed at a position opposite to a path of movement of the disk cutter 78 across the laminated film 12 so as to retain the disk cutter 78 when the disk cutter 78 is forced against the backup plate 92 with the laminated film 12 lying therebetween.

The rod-less cylinder 82 and cutter backup plate 92 are commonly supported on a single unit frame 94.

Figure 6:
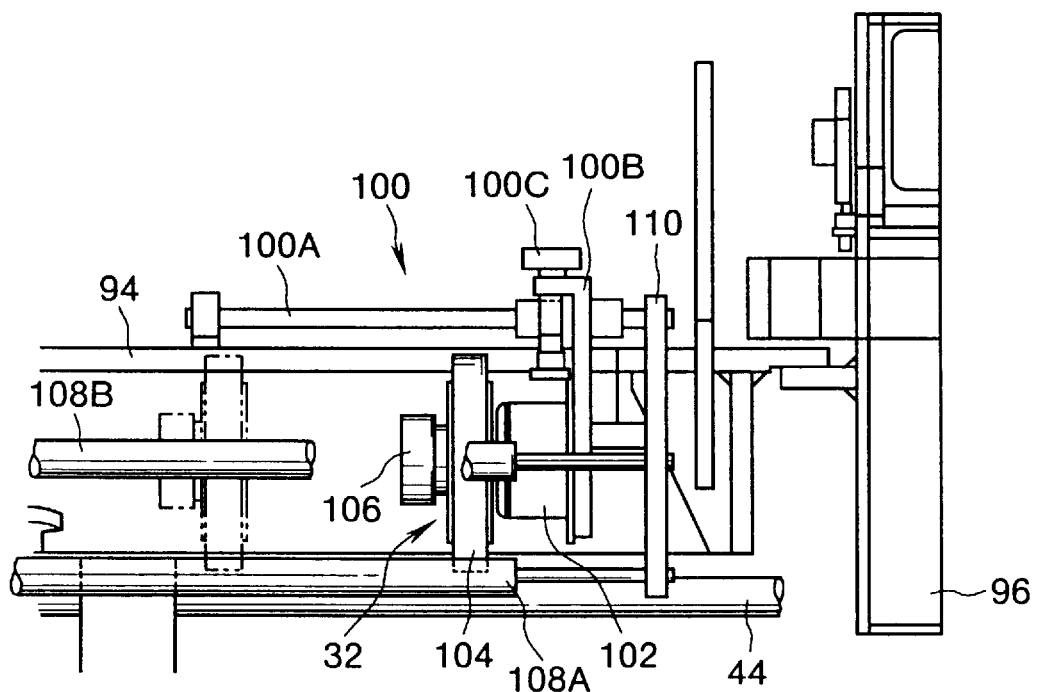
FIG. 6 is a rear view showing an adhesive tape supplying device in the same embodiment.

The unit frame 94 is laid parallel to the presser roll 34 and extends transversely across the width of the film applying apparatus 10. As shown in FIG. 6, the unit frame 94 is fixed at its opposite ends to confronting sidewalls (one being shown) 96 of the apparatus.

The slide member 84, as shown in FIG. 4, has an upper end secured to the rod-less cylinder 82, the other end of the slide member 84 including a projection 84A projecting downwardly beyond the movable member 86 and extending transversely across the underside of the movable member 86.

The projection 84A extending transversely across the underside of the movable member 86 has opposite end portions projecting laterally outwardly from the movable member 86, and a pair of parallel spaced guide-roll supporting members 98 is attached at one end to the opposite end portions of the projection 84A and rotatably supports at the other end the guide rolls 80.

The movable member 86 is disposed between the pair of guide-roll supporting members 98 and slidable relative to the slide member 84 via a slide shoe 86A.

The spring 88 acts between the projection 84A of the slide member 84 and a spring retainer 86B projecting downwardly from the movable member 86, as shown in FIG. 4, and urges the movable member 86 in the left-hand direction in FIG. 4 with respect to the projection 84A. Reference characters 88A and 88B shown in FIGS. 4 and 5 denote a bolt and a nut, respectively, used for adjusting a set length of the spring 88.

The micrometer 90 is attached to the movable member 86 and has a spindle 90A extending in a space defined between the guide-roll supporting members 98 and having a front end engageable with an end face 84B of the slide member 84 to limit movement of the movable member 86 in the right-hand direction in FIGS. 4 and 5 which is taken against the force of the spring 88.

As shown in FIG. 6, each of the adhesive tape supplying devices 32 is movably supported on the unit frame 94 via a slide mechanism 100 and movable parallel to the presser roll 34 within a predetermined range of distance. The slide mechanism 100 includes a slide bar to 100A extending parallel to the presser roll 34, a slide member 100B slidably mounted on the slide bar 100A and supporting thereon a brake 102, and a set screw 100C for fastening the slide member 100B to the slide bar 100A at a desired position along the slide bar 100A.

A roll holder 106 is attached to the brake 102 for rotatably and detachably holding an adhesive tape roll 104.

The brake 102 serves to control or slow down the speed of rotation of the roll holder 106 to exert a tension greater than a predetermined value on each adhesive tape 30 when the adhesive tape 30 is unwound from the adhesive tape roll 104.

In FIGS. 1 and 6, reference characters 108A and 108B denote a pair of guide rolls for guiding the cover film 12C and the adhesive tapes 30 as they travel from the dancer roll 72 to the film-and-tape take-up device 40. The guide rolls 108A, 108B are secured to the unit frame 94 via a pair of support plates (one being shown) 110.

Figure 7:
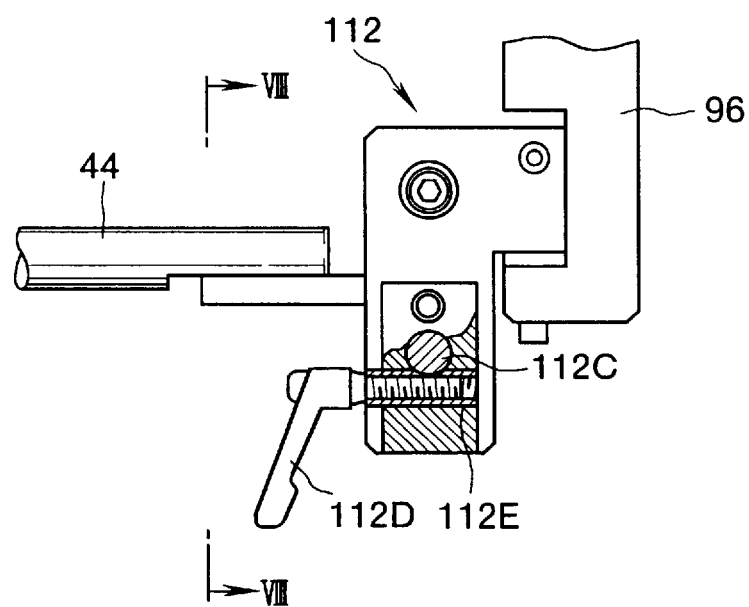
FIG. 7 is a front elevational view, with parts in cross section, of a mechanism for moving the adhesive tape supplying device back and forth in the same embodiment.
Figure 8:
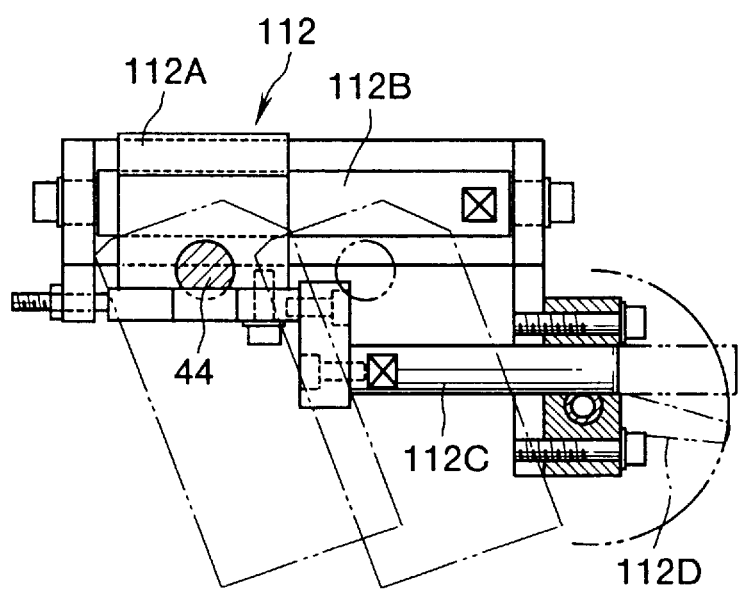
FIG. 8 is a cross-sectional view taken along the line VIII—VIII of FIG. 7.

The support shaft 44 of the presser roll actuating device 36 has opposite ends attached to the sidewalls 96 of the apparatus via an advancing/retracting mechanism 112, as shown in FIGS. 7 and 8, so that the support shaft 44 is movable back and forth within a predetermined range of distance in a direction perpendicular to the vertical surface 22A of the tacking member 22.

The advancing/retracting mechanism 112 includes a slide member 112A slidably supporting each end of the support shaft 44, a guide shaft 112B slidably supporting the slide member 112A in a plane perpendicular to the vertical surface 22A, a second guide shaft 112C attached is to the slide member 112A and parallel with the guide shaft 112B, and a fastening member 112E slidably guiding the second guide shaft 112C within a predetermined range of distance, the fastening member 112E being adapted to be securely fastened to the second guide shaft 112C when it is tightly fastened by a tightening handle 112D.

The range of movement of the support shaft 44 and all members supported on the support shaft 44 in a direction perpendicular to the vertical surface 22A, which is attained by the advancing/retracting mechanism 112, is defined by and between the position of the support shaft 44 indicated by the solid line shown in FIG. 1 and the position of the support shaft 44 indicated by the two-dot chain line shown in the same figure. The solid-lined position shown in FIG. 1 is a normal operating (setting) position, while the two-dot chain-lined position shown in the same figure is a retracted position which is provided to facilitate manual setting of the laminated film 12 and maintenance of the rotary cutter 42 and the tacking member 22.

Figure 9:
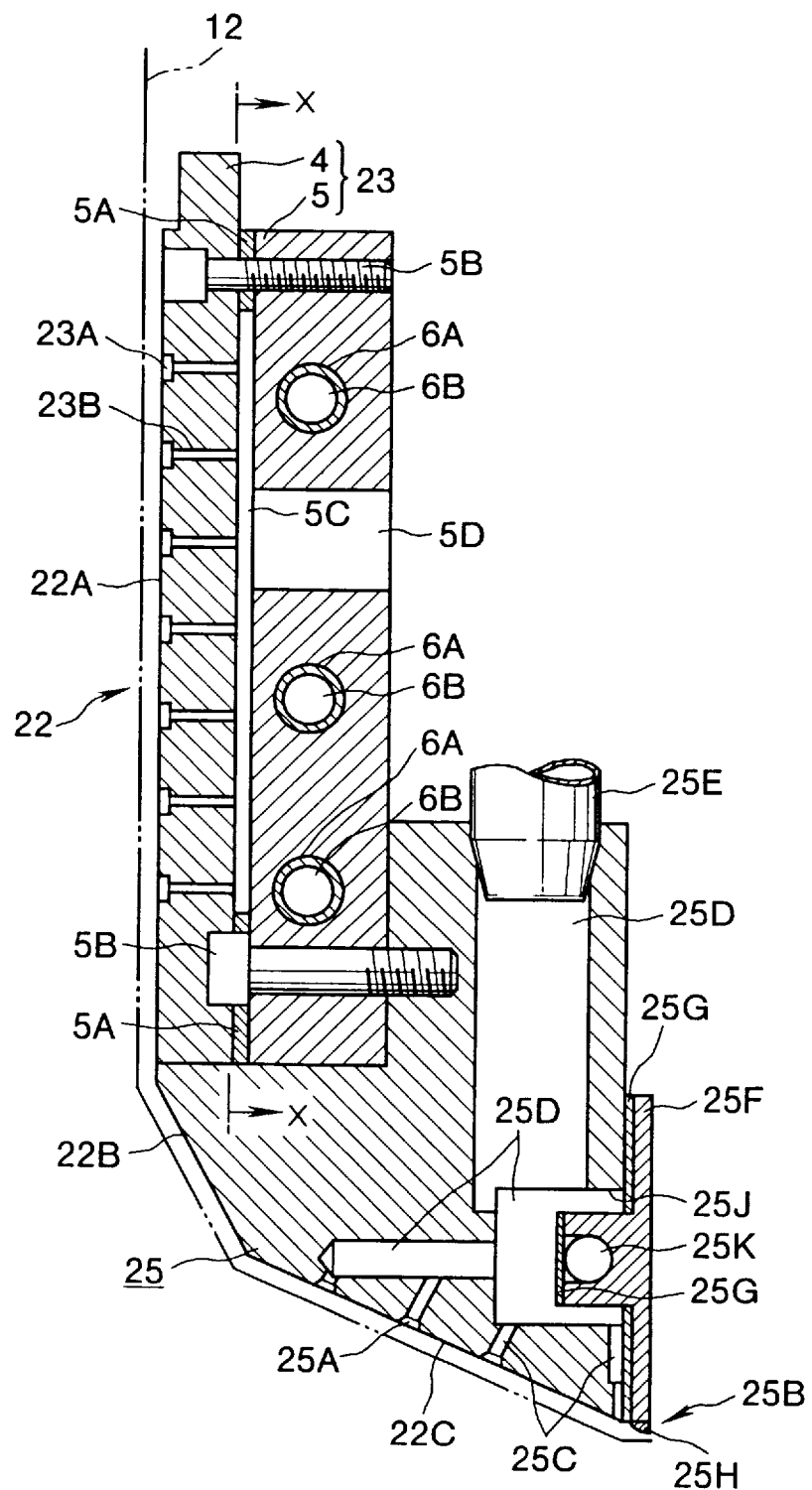
FIG. 9 is a vertical cross-sectional view showing, on enlarged scale, a tacking member in the same embodiment.

The tacking member 22, as shown on enlarged scale in FIG. 9, is composed of a flat main vacuum plate 23 laid parallel with the path 13 (FIG. 1) of the laminated film 12 and having the plurality of film suction grooves 23A formed in a front surface of the main vacuum plate 23, and a film-tacking member body 25 connected to a leading end, as viewed in the direction of feed of the laminated film 12, of the main vacuum plate 23 and having a front surface extending contiguously and obliquely from the front surface of the main vacuum plate 23 and having formed therein the plurality of film suction grooves 25A. The film-tacking member body 25 has a heater 25K embedded in the vicinity of a leading end portion 25B, as viewed in the direction of feed of the laminated film 12, of the film-tacking member body 25 for heating the leading end portion 25B.

The main vacuum plate 23 is composed of a suction plate 4 having a front surface facing the path of the laminated film 12 and formed with the film suction grooves 23A, and a backup member 5 attached by screws 5B to the back of the suction plate 4 with a frame-like heat-resistant rubber packing or gasket 5A disposed therebetween.

As shown in FIG. 9, three parallel spaced pipes 6A pass through the backup member 5 in a direction transverse to the direction of feed of the laminated film 12. The pipes 6A are parallel with the film path 13 (FIG. 1) and each define a water passage hole 6B.

Figure 10:
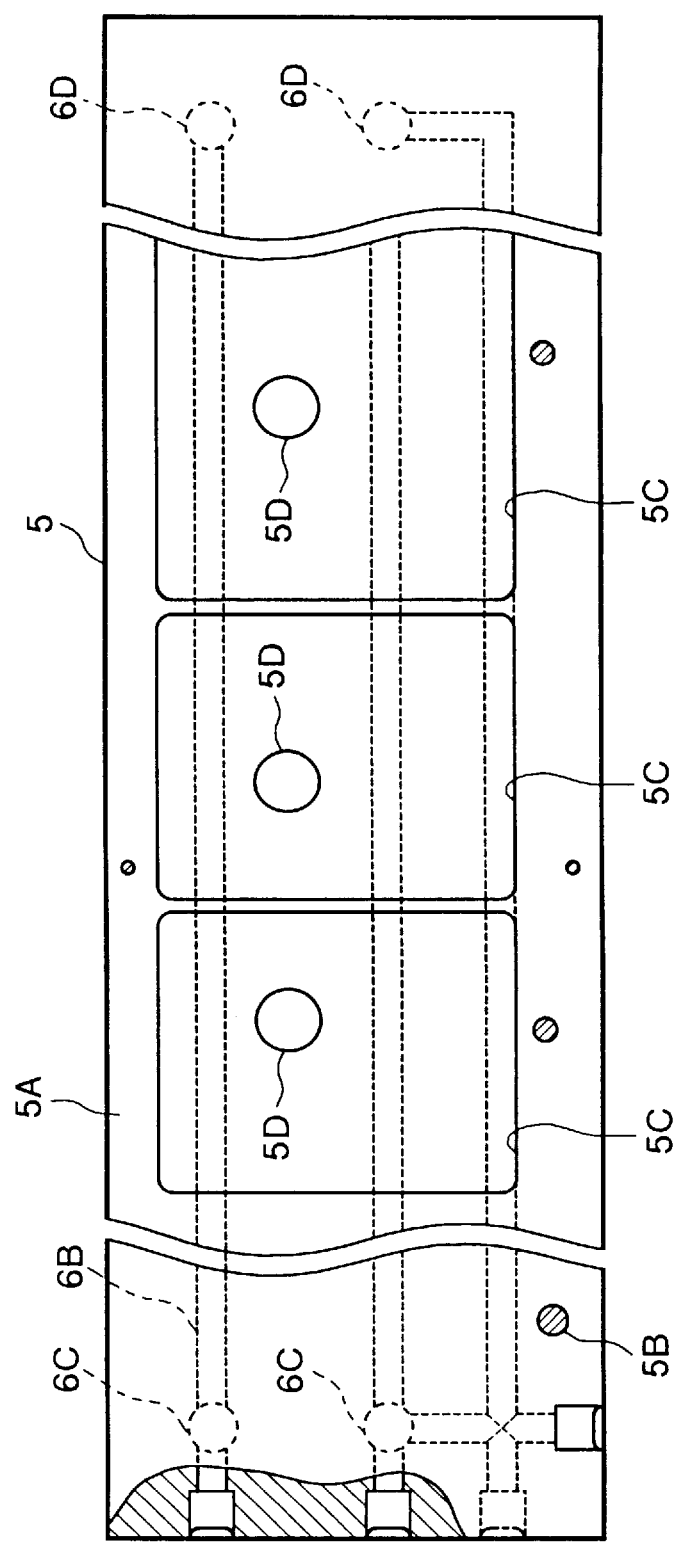
FIG. 10 is a cross-sectional view taken along the line X—X of FIG. 9.

As shown in FIG. 10, the backup member 5 further has a plurality of inlet ports 6C formed in a perpendicular direction of the water passage holes 6B for introducing therefrom a cooling water into the water passage holes 6B. The cooling water thus introduced flows along the water passage holes 6B in the widthwise direction of the laminated film 12 and thereafter is discharged from a plurality of outlet ports 6D located at an end of the water passage holes 6B remote from the inlet ports 6C The heat-resistant rubber packing 5A has a plurality of vacuum spaces 5C arranged in the widthwise direction of the laminated film. Each of the vacuum spaces 5C is communicated with a vacuum source (not shown) via a vacuum port 5D extending through the thickness of the backup member 5 and located substantially at a central portion of the vacuum space 5C.

The film suction grooves 23A formed in the suction plate 4 extend in a direction transverse to the film feed direction and are spaced in the film feed direction. Each of the film suction grooves 23A has a plurality of vacuum holes 23B connected at one end to the film suction groove 23A and opening at the other end to the vacuum space 5C.

As shown in FIG. 9, the film-tacking member body 25 has the aforesaid first and second beveled surfaces 22B and 22C extending contiguously and obliquely from the front surface (vertical surface 22A) of the main vacuum plate 23. The film suction grooves 25A are formed in the first and second beveled surfaces 22B, 22C and extend in a direction transverse to the direction of feed of the laminated film 12.

Thus, the tacking member 22 has, at its base plate 20 side, a leading end portion which includes the aforesaid vertical surface 22A forming the front surface of the suction plate 4 and extending along the path 13 of the laminated film 12, the aforesaid first beveled surface 22B extending obliquely from a leading end of the vertical surface 22A in a direction away from the path 13, and the aforesaid second beveled surface 22C extending obliquely from a leading end of the first beveled surface 22B in a direction away from the path 13.

The film suction grooves 25A formed in the first and second beveled surfaces 22B and 22C each communicate with a plurality of vacuum holes 25C arranged at appropriate intervals along the longitudinal direction of the film suction groove 25A. The vacuum holes 25C communicate with internal vacuum channels 25D of the film-tacking member body 25. The vacuum channels 25D is connected to the vacuum source (not shown) via a vacuum pipe 25E.

The leading end portion 25B of the film-tacking member body 25 is a lower end of a block member 25F, and the heater 25K is embedded in the block member 25F.

The block member 25F is coupled with the film-tacking member body 25 with a heat-resistant rubber seal 25G disposed therebetween. The lower end of the block member 25F, i.e., the leading end 25B is composed of a heat-resistant rubber piece 25H having a generally triangular cross section.

The block member 25F, for its attachment, is fitted with a plurality of mounting grooves 25J formed in the back of the film-tacking member body 25 and aligned with one another in the transverse direction of the laminated film 12.

The film applying apparatus 10 in the embodiment described above will operate as follows.

At first, the support shaft 44 is retracted by the advancing/retracting mechanism 112 to the position indicated by the two-dot chain line shown in FIG. 1, so as to define, between the presser roll 34 and the tacking member 22, a space for the passage therethrough of a laminated film 12. After the laminated film 12 is set through the space, the support shaft 44 is set by the advancing/retracting mechanism 112 to the advanced position indicated by the solid line shown in FIG. 1.

Then, before commencing the film applying operation, the contact pressure or force exerted from the presser roll 34 onto the first and second beveled surfaces 22B and 22C is adjusted to balance throughout the width of the presser roll 34. In this instance, since the support frame 48 supporting the opposite ends of the presser roll 34 extends parallel with the presser roll 34 and is attached substantially at its central portion to the support shaft 44, the contact pressure adjustment work can be achieved easily. Then, cooling water is introduced into the water passage holes 6B in the main vacuum plate 23 of the tacking member 22 for cooling the suction plate 4.

Figure 11:
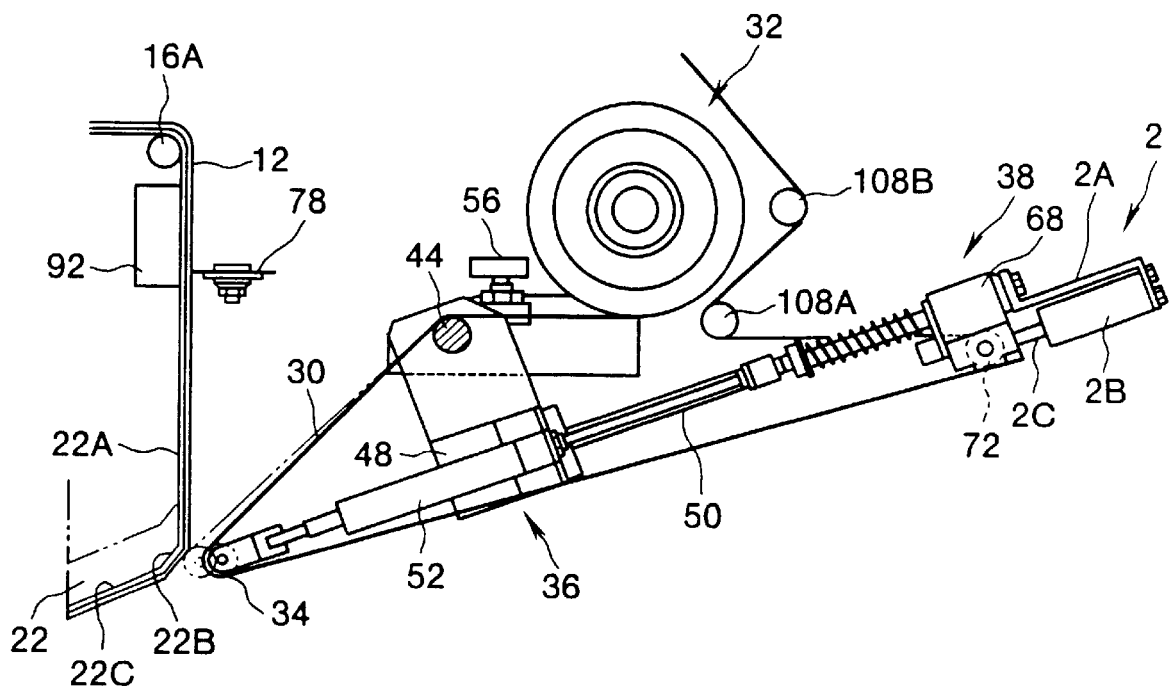
FIG. 11 is a diagrammatical side view of the apparatus in the same embodiment shown in a standby state or condition taken in a process of peeling a cover film.

Now, as shown in FIG. 11, the laminated film 12 extends downward from vertical surface 22A of the tacking member 22 to the second beveled surface 22C across the first beveled surface 22B. The thus supplied laminated film 12 is locked in the condition illustrated in FIG. 11 by the action of a negative pressure or suction created on the surfaces 22A–22C in the vicinity of the suction grooves in the tacking member 22.

Then, the half-cut device 28 is activated to cut or sever the cover film 12 and the photosensitive layer 12B at an upstream position determined to ensure that a desired length of the photosensitive layer 12B can be exposed in a subsequent cover-film separating or peeling process. In this instance, the half-cut device 28 may slightly cut in the base film 12A.

The foregoing half-cut process is achieved by activating the rod-less cylinder 82 of the half-cut device 22 to move the slide member 84 in the widthwise or transverse direction of the laminated film 12 while to rotating disk cutter 78. The disk cutter 78 bites into the cover film 12C and the photosensitive layer 12B and severs them transversely with laminated film 12 held between the disk cutter 78 and the cutter backup plate 92.

During that time, the guide rolls 80, disposed in front and in the rear of the disk cutter 78 as viewed from the direction of movement of the disk cutter 78 and having the same position as the cutting edge 78A of the disk cutter 78 as viewed from the direction of the thickness of the laminated film 12, continuously force the laminated film 12 against the cutter backup plate 92. The laminated film 12 while being severed can, therefore, be held stably in position without displacement with the result that the disk cutter 78 can only sever the cover film 12C and the photo-conductive layer 12B. In addition, since the disk cutter 78 is retracted when the front or leading guide roll 80 runs on an edge of the cutter backup plate 92, for example, there is no possibility of breaking or otherwise damaging the cutting edge 78A of the disk cutter 78 due to collision with the cutter backup plate edge. Furthermore, since the cutter backup plate 92 is made of rigid plastic or metal, the laminated film 12 a whole is unlikely to become distorted while the disk cutter 78 is undertaking a limited severance of the cover film 12 and the photosensitive layer 12B. The cutter backup plate 92 made of such a rigid material as specified above also enables a fine adjustment of the cutting depth taken by the disk cutter 78, which will ensure a precision cutting effected exclusively against the cover film 12C and the photosensitive layer 12B.

Figure 12:
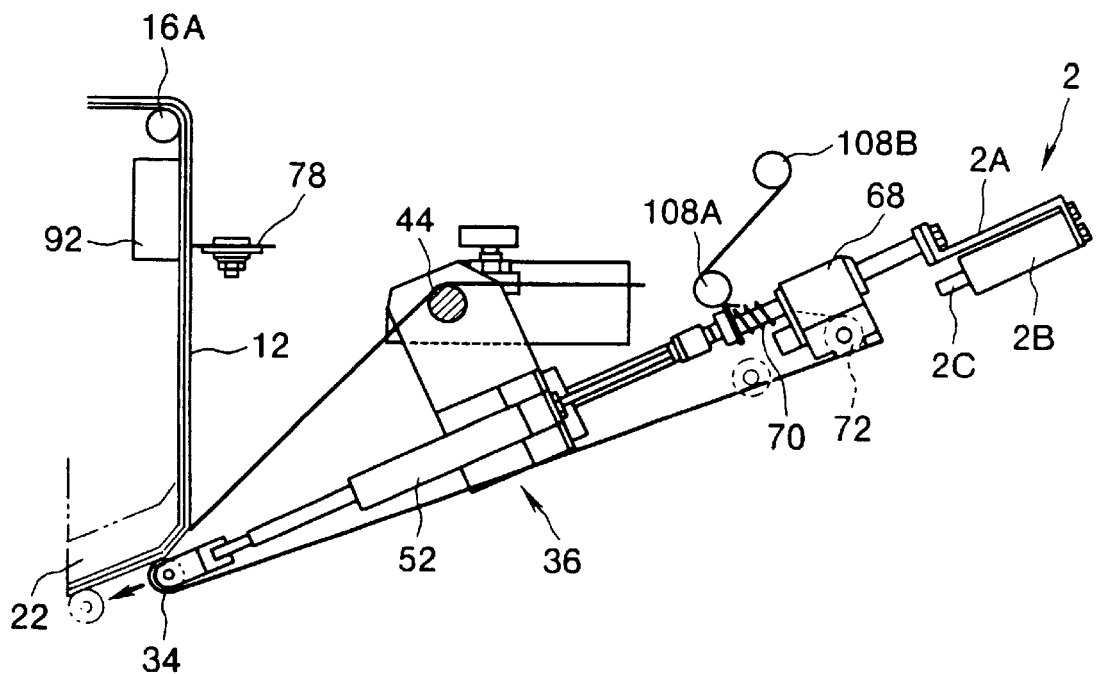
FIG. 12 is a diagrammatical side view showing an adhesive-tape forcing step taken in the cover-film peeling process.

Then, the actuators 52 of the presser roll actuating device 36 are driven to advance the linear shafts 50 and the presser roll 34 supported thereon, thereby causing the presser roll 34 to roll on from the first beveled surface 22B to a leading end of the second beveled surface 22 of the tacking member 22 while continuously forcing the adhesive tapes 30 against the cover film 12C (see FIG. 12). During that time, the brakes 102 (FIG. 6) of the adhesive tape supplying device 32 are activated to lock the roll holders 106 to limit unwinding of the adhesive tapes 30 with the result that the adhesive tapes 30 are fed back or supplied from the film-and-tape take-up device 40 side via the dancer roll 72.

In this instance, if the film-and-tape take-up device 40 is locked, the adhesive tapes 30 supplied toward the first and second beveled surfaces 22B and 22C force the dancer roll 72 in a direction to compress the film pullback springs 70. Thus, a path along which the adhesive tapes 30 are supplied can be reduced.

Figure 13:
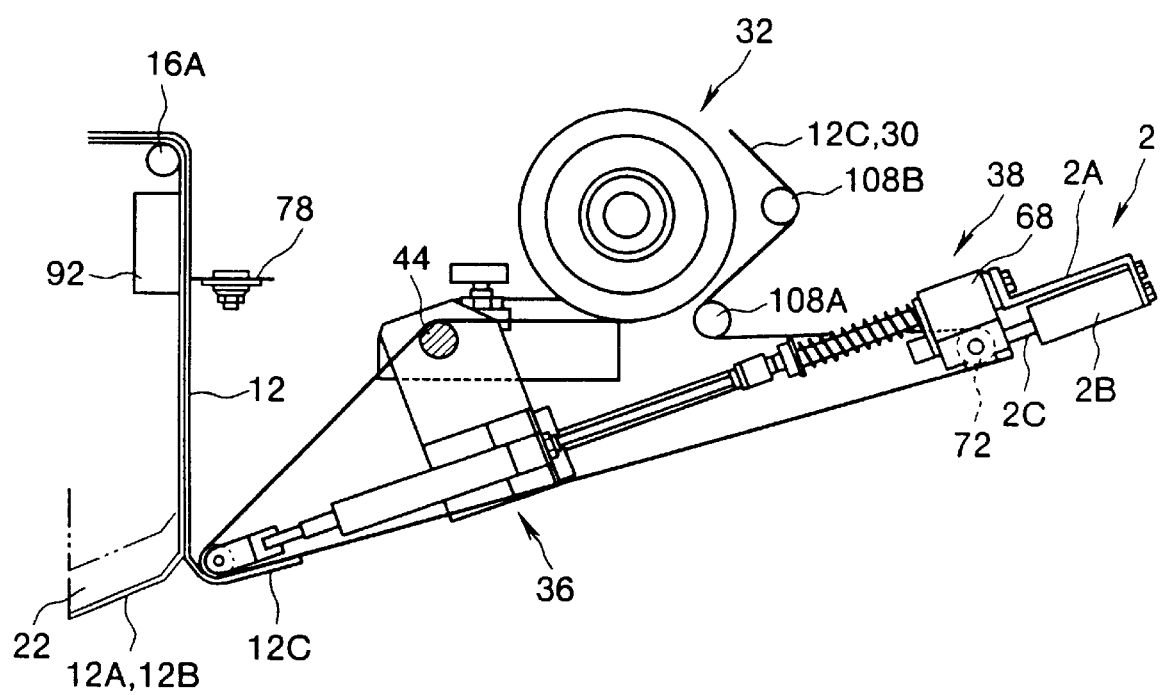
FIG. 13 is a diagrammatical side view showing the condition in which a presser roll is disposed in a retracted position in the cover-film peeling process.

Then, as shown in FIG. 13, the actuators 52 are driven to return the presser roll 34 to the initial position via the linear shafts 50. In this instance, the adhesive tapes 30 are pulled back as the film pullback springs 70 urging the dancer roll 72 restore their original length. With this backward movement of the adhesive tapes 30, the cover film 12C adhering to the adhesive tapes 30 is peeled off or separated from the base film 12A and the photosensitive layer 12B.

Figure 14:
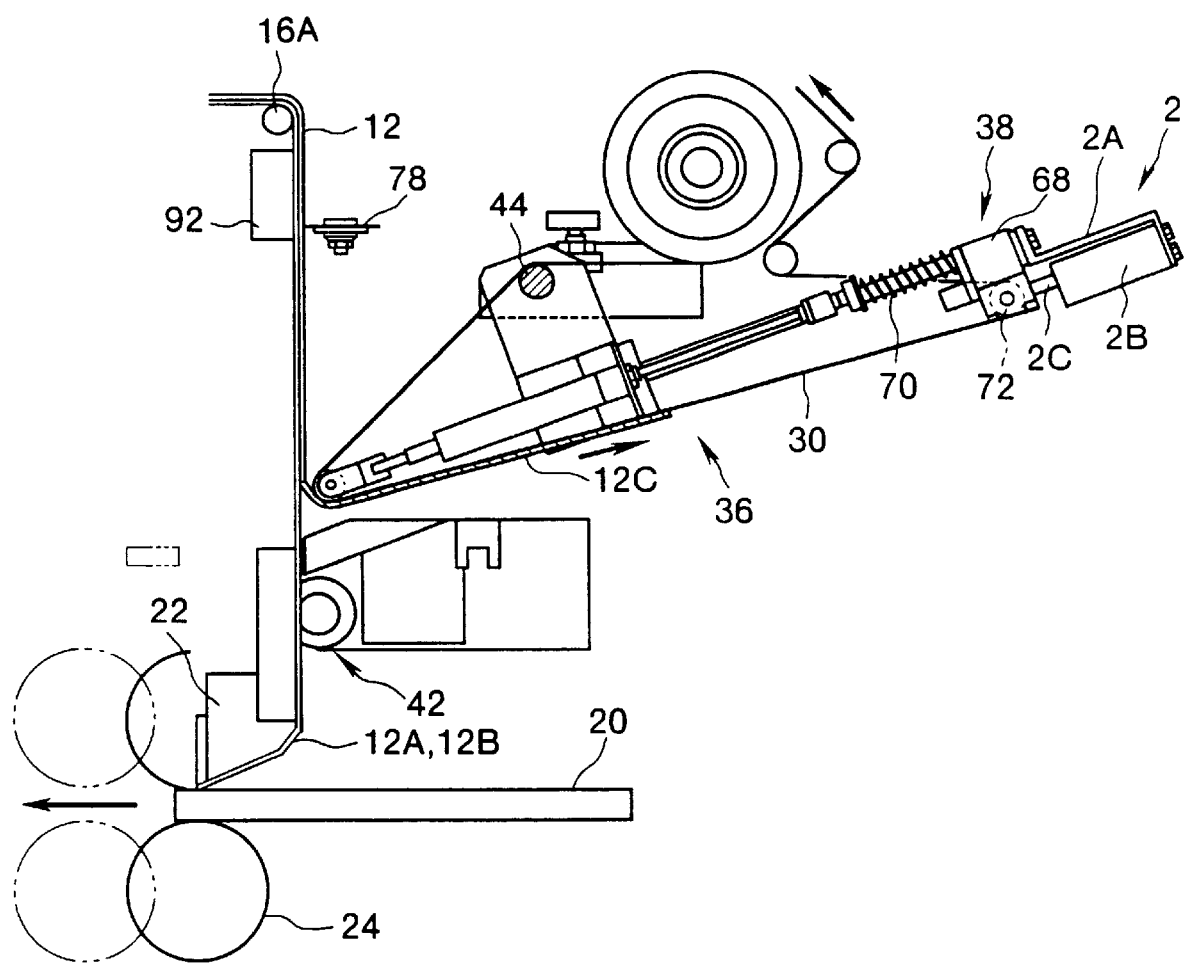
FIG. 14 is a diagrammatical side view of the apparatus in the same embodiment shown in a position to achieve a laminated-film tacking step after the cover film is separated.

Subsequently, as shown in FIG. 14, the tacking member 22 is lowered so that the base film 12A and the photosensitive layer 12B while being held by suction on a leading end of the tacking member 22 are temporarily attached or tacked on a leading end portion of a base plate 20 with the photosensitive layer 12B sandwiched between the base film 12A and the base plate 20. In synchronism with the downward movement of the tacking member 22, the film-and-tape take-up device 40 is driven to take up the adhesive tapes 30 and the cover film 12B bonded thereto. In this instance, the adhesive tape supply device 32 unwinds the adhesive tapes 30 while applying a constant tension to the adhesive tapes 30 by the action of the brakes 102.

When the tacking member 22 completes its operation for tacking the base film 12A and the photosensitive layer 12B to the leading end portion of the base plate 20, it is moved upwardly away from the base plate 20 and returns to the position shown in FIG. 13

In this instance, application of the negative pressure or suction acting to the tacking member 22 is ceased and, hence, the laminated film 12 could be pulled upwardly without being attracted to the tacking member 22. However, since the cover film 12C is adhered to the adhesive tapes 30, and since the adhesive tapes 30 are held immovable between the adhesive tape supplying device 32, the presser roll 34, the dancer roll 72 and the film-and-tape take-up device 40, the laminated film 12 is also held in the immovable condition.

Although the tension roll 16A of the film tension mechanism 16 is urged upwardly by the spring 16C, it is not possible to pull the laminated film 17 upwardly against the force of the film pullback springs 70 as long as the spring constant of the spring 16C is smaller than the spring constant of the film pullback springs 70.

Thus, a portion of the laminated film 12 extending from the tacked leading end to the tacking member 22 is in a slackened state. Accordingly, if the thus slackened laminated film portion were pressure-boned to a next base plate 20, generation of wrinkles on the laminated film 12 or generation of bubbles between the laminated film 12 and the base plate 20 would result.

Figure 15:
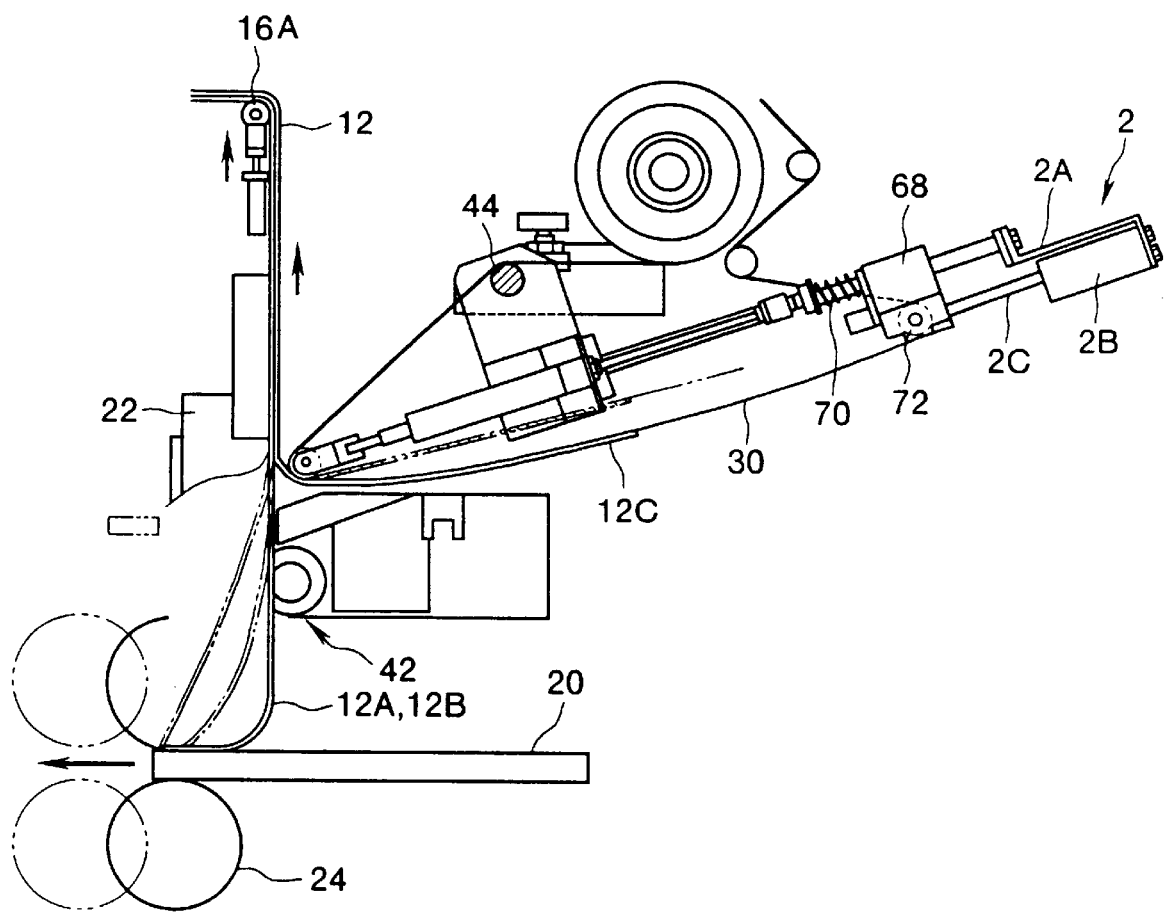
FIG. 15 is a diagrammatical side view showing a laminated-film pullback process in the same embodiment achieved after the tacking step.
Figure 16:
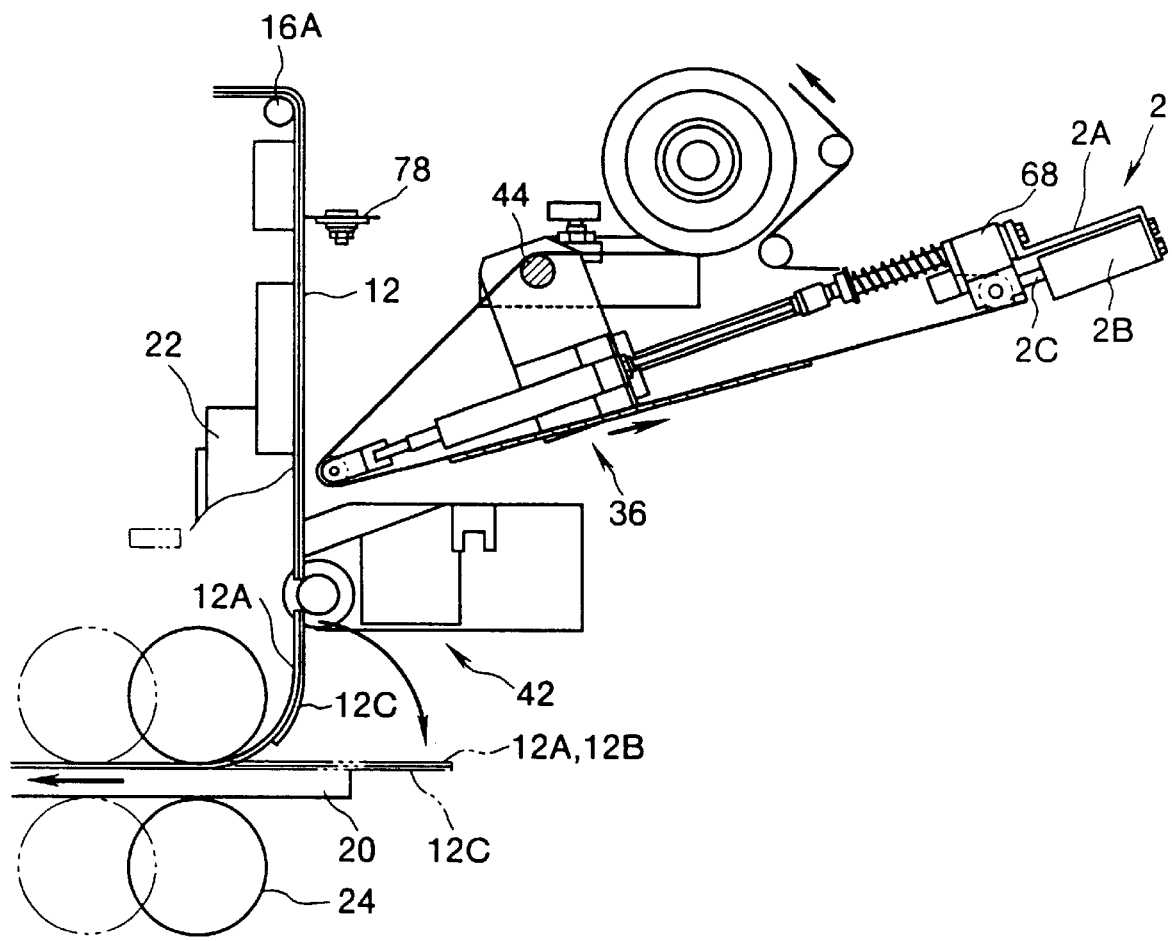
FIG. 16 is a diagrammatical side view showing a condition immediately before the end of a process for applying the laminated film to the base plate in the same embodiment.

In this embodiment, however, as shown in FIG. 15, subsequent to completion of the tacking operation by the tacking member 22, either in the course of or after completion of an upward movement of the tacking member 22, each pushing cylinder 2B of the slackening device 2 is activated so that the actuating rod 2C of the pushing cylinder 2B pushes or forces the corresponding bearing member 68 in a direction toward the presser roll 34 against the force of the film pullback spring 70

This will cause the adhesive tapes 30 and the cover film 12C adhered to the same to become slack between the presser roll 34 and the dancer roll 72. The adhesive tapes 30 and the cover film 12C can, therefore, be pulled in the direction toward the tension roll 16A by a distance equal to the amount of slack produced Either simultaneously with the start of foregoing operation of the pushing cylinders 2B, or after the end of the foregoing operation of the pushing cylinders 2B, the lift-up cylinders 1A (one being shown) are driven so that the actuating rods 1B of the respective lift-up cylinders 1A lift the opposite ends of the tension roll 16A upwardly in FIG. 15, thereby pulling the laminated film 12 upwardly.

Thus, as shown in FIG. 15, the laminated film 12 which has been left slackened after tacking is pulled up-wardly to such an extent that a subsequent pressure-bonding process by the lamination rolls 24 can be achieved satisfactorily without involving generation of wrinkles or bubbles as previously described.

In this instance, if the laminated film 12 is pulled up to the position indicated by the dash-and-dot lines shown in FIG. 15, the pressure-bonding process by the lamination rolls 24 cannot be achieved. It is therefore preferable that the stroke of the pushing cylinders 2B is so adjusted as to permit the laminated film 12 to be pulled upwardly until it assumes the position of the laminated film 12 indicated by the two-dot chain lines shown in FIG. 15.

The lift-up cylinders 1A of the film tensioning device 1 are constructed such that the actuating rods 1B return to their retracted position immediately after they lifted up the tension roll 16A. Since the tension roll 16A supported on the pivot arm 16B is urged upwardly (i.e., in a direction to tension or stretch the laminated film 12) by the spring 16C, descending movement of the tension roll 16A toward the base plate 20 does not occur even when the lift-up cylinders 1A are activated to contract their actuating rods 1B.

Then, prior to the pressure-bonding process achieved by the lamination rolls 24, the rotary cutter 42 is driven to cut or sever the laminated film 12 transversely at a position which, as shown in FIG. 15, is higher than, i.e., upstream of, a cutting line already formed in the cover film 12C (and also in the photosensitive layer 12B) by the disk cutter 78.

As a result of this cutting, a cover film 12C of a fixed length is left at a trailing end side of the base film 12A and the photosensitive layer 12B.

Figure 17:
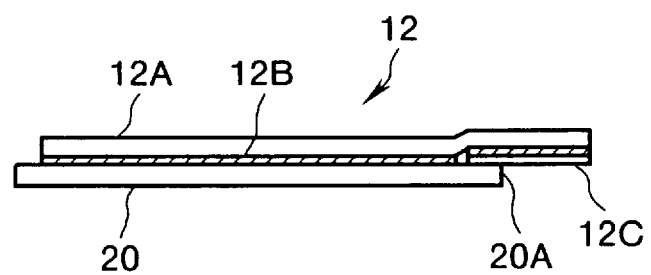
FIG. 17 is a schematic cross-sectional view showing the laminated film applied to the base plate by the apparatus in the same embodiment.
Figure 18:
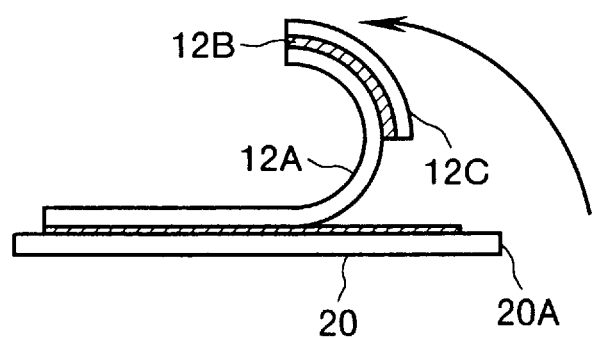
FIG. 18 is a schematic cross-sectional view illustrative of the manner in which a base film is peeled, with a photosensitive layer left on the base plate.

The length of this cover film 12C is determined such that the cover film 12C projects from the trailing end 20A of the base plate 20 by a fixed distance in the range of 1 to 2 cm, for example, as shown in FIG. 17.

With this arrangement, a portion of the photosensitive layer 12B projecting from the trailing end 20A of the base plate 20 is sandwiched between the base film 12A and the cover film 12C. A projecting portion having a threeply structure of the laminated film can be gripped by a nipping device (not shown) and hence is able to facilitate separation of the base film 12A which is achieved subsequently by using the nipping device. The photosensitive layer 12B is not exposed but covered by the cover film 12C and hence the base film separating process can be achieved smoothly without involving a problem which would otherwise be caused due to adhesion between the photosensitive layer 12B and the nipping device.

Throughout the film applying operation described above, cooling water is continuously introduced into the water passage holes 6B in the main vacuum plate 23 of the tacking member 22 and, hence, the suction plate 4 is cooled and does not reach a high temperature. The lamination film 12 held by suction on the thus cooled suction plate 4 is, therefore, free from a problem caused from the effect of high temperatures, such as non-uniform heat history, uneven thickness or unstable viscosity of the photosensitive resin layer 12B.

The photosensitive resin layer 12B is stable in viscosity, so that when the cover film 12C is separated by the adhesive tapes 30 from the photosensitive resin layer 12B and the base film 12A, the peeling moves smoothly and continuously. The separation can, therefore, be achieved smoothly with no transverse wrinkle formed on the photosensitive resin layer 12B. In addition, since the tacking member 22 does not reach a high temperature, no recessed pattern is formed on the laminated film 12 and the base film 12A, in particular while the laminated film 12 is held by suction on the tacking member 22 formed with the film suction grooves 23A, 25A. Thus, the photosensitive resin layer 12B is kept uniform in thickness Furthermore, with the use of the tacking member 22 provided with a cooling means, a uniform heat history is afforded to the photosensitive resin layer 12B. The photosensitive resin layer 12B is uniform in thickness, has a uniform heat history, is stable in viscosity and is free from surf ace irregularities. Accordingly, a wiring pattern formed on the base plate after exposure and development of the photosensitive layer has a uniform width and free from a development failure such as an intrusion, a mouse nip or a break.

In the embodiment described above, the slackening device 2 is so constructed as to force the dancer roll 72 toward the presser roll 34, thereby providing a slack on the adhesive tapes 30 and the cover film 12C adhered thereto. This invention should by no means be limited to the illustrated embodiment but may include any arrangement in which the adhesive tapes 30 and the cover film 12C are slackened between the presser roll 34 and the film-and-tape take-up device 40. In one example of such arrangement, a tension roll is disposed between the dancer roll 72 and the film-and-tape take-up device 40. The tension roll normally elongates the length of a film path but can provide a slack on the adhesive tapes 30 and the cover film 12C when it is displaced in a direction to reduce the film path. The actuators used for providing a slack should by no means be limited to the cylinders but may be replaced by motors.

In the embodiment described above, after the tacking operation by the tacking member 22 completes, the slackening device 2 operates to slack the adhesive tapes 30 and the cover plate 12C, and the film tensioning device 1 operates to pull or stretch the laminated film 12 either at the same time as, or subsequent to, the slackening operation of the slackening device 2. The present invention is not limited to this embodiment but may includes a variation in which the laminated film 12 is pulled or stretched by the film tensioning device 1 with no slack provided by the slackening device. In this instance, the dancer roll 72 is forced by the adhesive tapes 30 and the cover film 12C to displace toward the presser roll 34 against the force of the film pullback springs 72.

Furthermore, the Lift-up cylinder 1A of the film tensioning device 1 is normally composed of an air or pneumatic cylinders which may be replaced by an oil hydraulic cylinder, a hydraulic cylinder or a gas cylinder. Suitable actuators other than the cylinder may include a motor.

The half-cut device 28 in the above-described embodiment includes a slide member 84 driven by the rod-less cylinder 82. The present invention should by no means be limited to this arrangement but may include a modification in which the slide member 84 is reciprocated in the widthwise direction of the laminated film by means of a drive unit such as a belt drive unit, a chain drive unit or a screw shaft.

Figure 19:
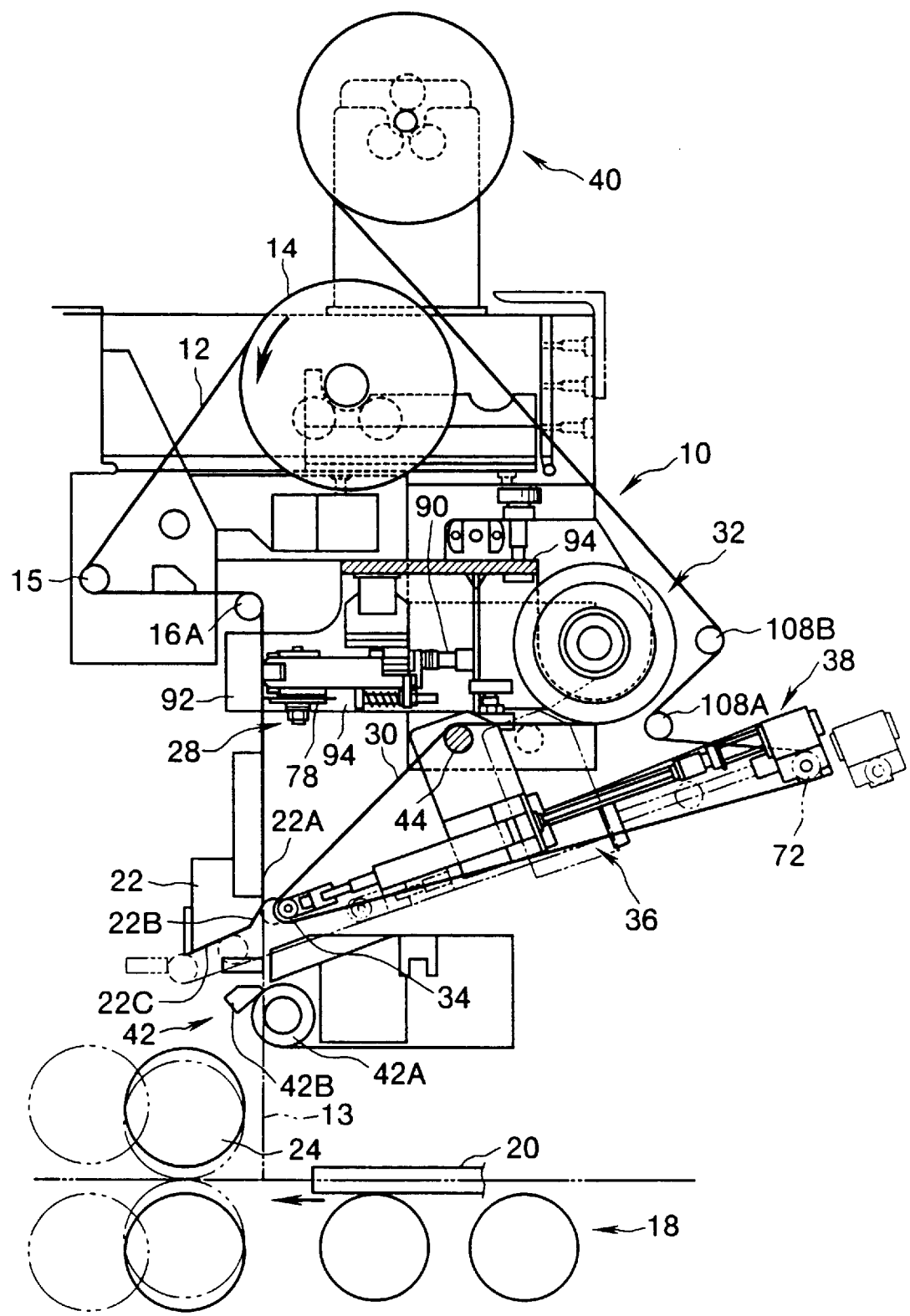
FIG. 19 is a view similar to FIG. 1, but showing a film applying apparatus according to another embodiment.

In the embodiment described above, the laminated film 12 is urged by the film tensioning mechanism 16 in a direction to pull back or stretch the laminated film 12, and while keeping this condition, and prior to the start of the film pressure-bonding operation by the lamination rolls 24, the film tensioning device 1 operates to drive or force the film tensioning mechanism 16 in a direction to pull back the laminated film by a predetermined distance. In this instance, the slackening device 2 operates to slacken the cover film 12C (including adhesive tapes 39), thereby enabling the laminated film 12 to be pulled backward. The present invention is not limited to this arrangement but may include another arrangement suitable for an application in which only a slight slack is produced immediately after the laminated film 12 is tacked to the base plate 20 by the tacking member 20, as shown in FIG. 19. The arrangement shown in FIG. 19 differs from the first embodiment shown in FIG. 1 in that the film tensioning mechanism 16, the film tensioning device 1 and the slackening device 2 are omitted.

According to the first embodiment described above, the water passage holes 6B are formed in the main vacuum plate 23. This invention should by no means be limited to this embodiment but may includes another embodiment shown in FIG. 20 in which a water passage hole 6B is defined by a pipe 6A placed in the film-tacking member body 25.

Figure 20:
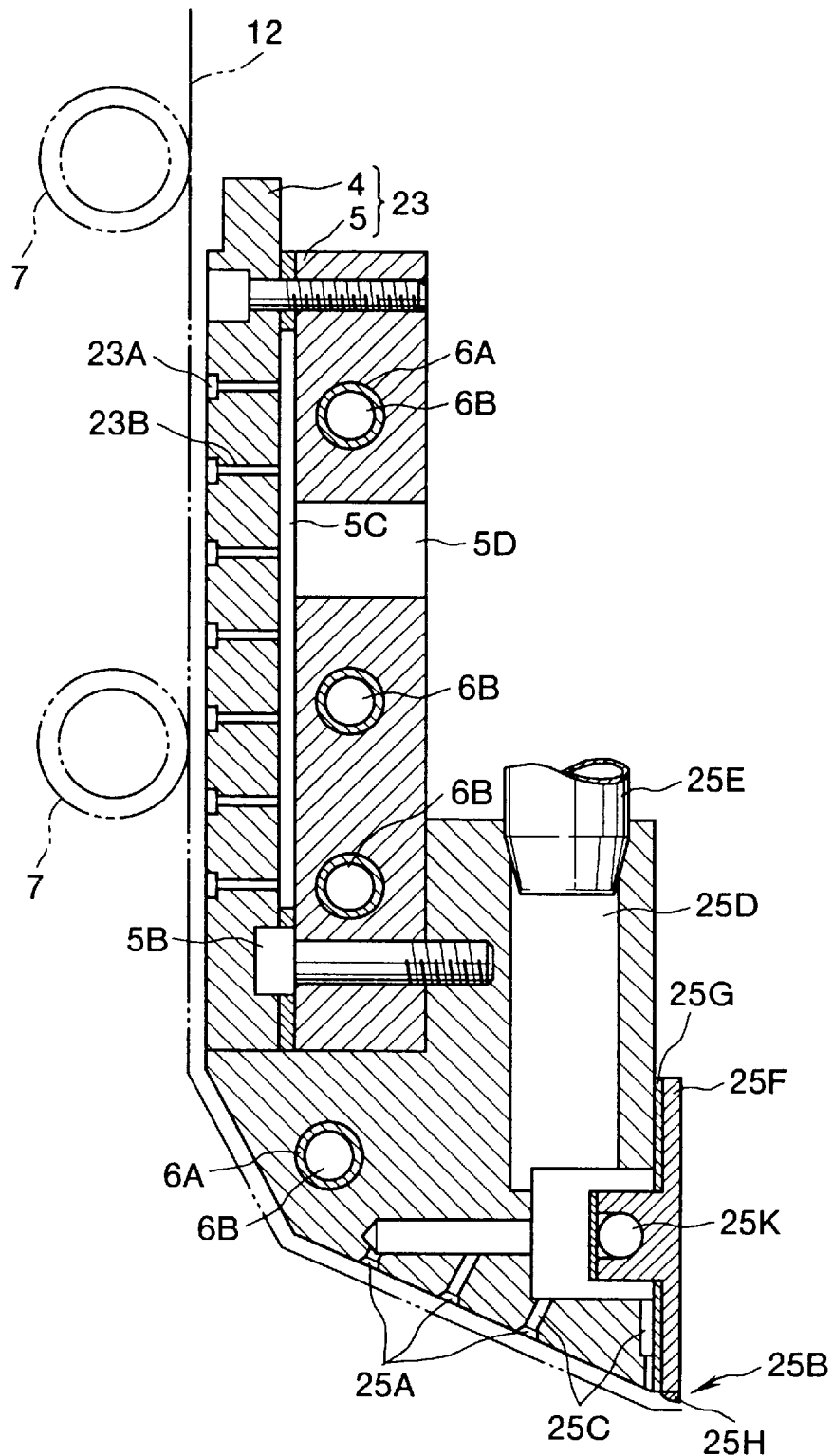
FIG. 20 is a view similar to FIG. 9 but showing a tacking member according to another embodiment.
Figure 21:
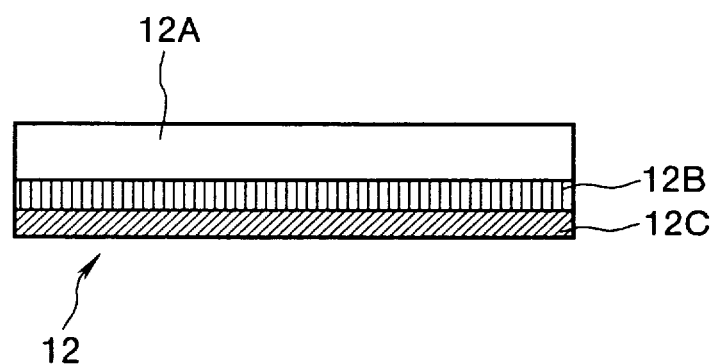
FIG. 21 is an enlarged cross-sectional view showing a laminated film.

Furthermore, as indicated by the two-dot chain lines shown in FIG. 20, two cooling rolls 7 each defining therein a water passage hole 6B are disposed in such a position that the laminated film 12 is gripped between the cooling rolls 7 and the tacking member 22. The number of the cooling rolls may be one or alternately three or more, and they may be disposed in a position in the vicinity of the tacking member 22 including an upstream side of the tacking member 22.

The arrangement shown in FIG. 20 insures an efficient cooling because the laminated film 12 is cooled from its both sides.

In the embodiments previously described, the water passage holes 6B are each composed of a pipe. As an preferred alternative, the water passage holes are formed directly in the tacking member 22.

The pipes are preferably made of a corrosion-resistant material such as stainless steel. In this instance, the tacking member 22 is preferably made of a material such as anodized aluminum which is inferior in corrosion-resistance to the stainless steel but superior in heat conductivity to the stainless steel.

In the illustrated embodiments, the water passage holes are supplied with water as a cooling fluid. However, another cooling fluid, such as cooling oil or alcohol may be used. It is preferable that the cooling fluid is of the type capable of maintaining the surface of the suction plate 4 of the main vacuum plate 23 at a temperature in the range of 20°–30°.

Obviously, various modifications and variations of the present invention are possible in the light of the above teachings It is therefore to be understood that within the scope of the appended claims the invention may be practiced otherwise than as specifically described.

What is claimed is:

1. A film applying apparatus of the type wherein a continuous laminated film wound on a film supply roll and composed at least of a base film, a photosensitive layer and a cover film laminated one above another is guided via guide rolls to a leading end of a base plate while being conveyed by a conveying means, then tacked by a tacking member to the leading end of the base plate with the cover film peeled from the photosensitive layer, and thereafter applied to the base plate under pressure by lamination rolls while conveyance of the base plate is further continued, characterized by comprising:

said tacking member having, at its base plate side, a
leading end portion including a vertical surface extending along a path of the laminated film, a first beveled
surface extending obliquely from a leading end of said
vertical surface in a direction away from said path, a
second beveled surface extending obliquely from a
leading end of said first beveled surface in a direction
away from said path, and suction holes formed in said
vertical surface, said first beveled surface and said
second beveled surface being for holding the laminated
film by suction on these surfaces;

a half-cut device disposed upstream of said tacking member and movable in the widthwise direction of the
laminated film for cutting the cover film and the
photosensitive layer, with the base film left uncut;

an adhesive tape supplying device disposed adjacent to
said tacking member for supplying an adhesive tape in
a direction having a component in the direction of
movement of the laminated film while keeping the
adhesive tape in substantially confronted relation to the
laminated film;

a presser roll extending in the widthwise direction of the
laminated film and rollingly engageable with said first
and second beveled surfaces of said leading end portion
of said tacking member, said presser roll guiding therearound the adhesive tape with its adhesive side facing
outward;

a presser roll actuating device rotatably supporting
thereon said presser roll and operable to force said
presser roll against said leading end portion of said
tacking member to cause said presser roll to roll on
from said first beveled surface to a leading end of said
second beveled surface to thereby force the adhesive
tape into adhesion with the cover film, said presser roll
actuating device being also operable to move said
presser roll in a direction away from a position of said
leading end of said second beveled surface;

adhesive-tape pullback means for pulling the adhesive
tape in a direction away from said first and second
beveled surfaces in synchronism with the movement of
said presser roll when said presser roll is moved in a
direction away from said second beveled surface;

a film-and-tape take-up device for taking up the adhesive
tape and a portion of the cover film bonded to the
adhesive tape and separated from the photosensitive
layer on the base film as the adhesive tape is pulled in
the direction away from said first and second beveled
surfaces;

wherein each of said guide rolls is composed of a tension
roll urged by a spring via a pivot arm in such a direction
as to pull the laminated film backward, said tension roll
said spring and said pivot arm constituting a laminated
film tensioning mechanism, and wherein a film tensioning device is disposed to secure engagement with
said laminated film tensioning mechanism and engageable with said laminated film tensioning mechanism to
force said tension roll in a direction to tension the
laminated film by a predetermined distance for at least
a part of a time period between initiation of movement
of the tacking member in a direction away from the
base plate and initiation of pressure-bonding of the
laminated film by the lamination rolls after the laminated film is tacked by said tacking member to the
leading end of the base plate, with the cover film
separated from the laminated film; and wherein a slackening device is disposed for slackening the
adhesive tape and the cover film bonded thereto at a
portion of the adhesive tape extending between said
presser roll and said film-and-tape take-up device at a
time subsequent to the initiation of movement of said
tacking member in the direction away from the base
plate, and before or simultaneously with the start of
tensioning of the laminated film by said film tensioning
device.

2. The film applying apparatus according to claim 1,
wherein said slackening device is composed of a pushing
device, a dancer roll of said adhesive-tape pullback means
disposed between said pushing device and said presser roll
actuating device, said slackening device operative to force
said dancer roll relative to said presser roll actuating device
and in a direction toward said presser roll.

3. The film applying device according to claim 2, wherein
said adhesive-tape pullback means includes a guide shaft so
provided as to project toward said slackening device and
movable back and forth in unison with said presser roll, and
a bearing member slidably supported on said guide shaft and
urged by a film pullback spring in a direction away from the
presser roll, said bearing member rotatably supporting
thereon said dancer roll, and wherein said pushing device
comprises a cylinder device, said cylinder device including
a cylinder and a rod, one of said cylinder and said rod being
connected to said guide shaft and the other of said cylinder
and said rod being connected to said bearing member.

4. A film applying apparatus of the type wherein a
continuous laminated film wound on a film supply roll and
composed at least of a base film, a photosensitive layer and
a cover film laminated one above another is guided via guide
rolls to a leading end of a base plate while being conveyed
by a conveying means, then tacked by a tacking member to
the leading end of the base plate with the cover film peeled
from the photosensitive layer, and thereafter applied to the
base plate under pressure by lamination rolls while conveyance of the base plate is further continued, characterized by
comprising:

said tacking member having, at its base plate side, a
leading end portion including a vertical surface extending along a path of the laminated film, a first beveled
surface extending obliquely from a leading end of said
vertical surface in a direction away from said path, a
second beveled surface extending obliquely from a
leading end of said first beveled surface in a direction
away from said path, and suction holes formed in said
vertical surface, said first beveled surface and said
second beveled surface being for holding the laminated
film by suction on these surfaces;

a half-cut device disposed upstream of said tacking member and movable in the widthwise direction of the
laminated film for cutting the cover film and the
photosensitive layer, with the base film left uncut;

an adhesive tape supplying device disposed adjacent to
said tacking member for supplying an adhesive tape in
a direction having a component in the direction of
movement of the laminated film while keeping the
adhesive tape in substantially confronted relation to the
laminated film, a presser roll extending in the widthwise direction of the
laminated film and rollingly engageable with said first
and second beveled surfaces of said leading end portion
of said tacking member, said presser roll guiding therearound the adhesive tape with its adhesive side facing
outward;

a presser roll actuating device rotatably supporting
thereon said presser roll and operable to force said presser roll against said leading end portion of said tacking member to cause said presser roll to roll on from said first beveled surface to a leading end of said second beveled surface to thereby force the adhesive tape into adhesion with the cover film, said presser roll actuating device being also operable to move said presser roll in a direction away from a position of said leading end of said second beveled surface;

adhesive-tape pullback means for pulling the adhesive tape in a direction away from said first and second beveled surfaces in synchronism with the movement of said presser roll when said presser roll is moved in a direction away from said second beveled surface;

a film-and-tape take-up device for taking up the adhesive tape and a portion of the cover film bonded to the adhesive tape and separated from the photosensitive layer on the base film as the adhesive tape is pulled in the direction away from said first and second beveled surfaces; and wherein said adhesive-tape pullback means comprises a dancer roll mounted on said presser roll actuating device in parallel relation to said presser roll and movable in the direction of reciprocation of said presser roll while the adhesive tape and the cover film separated by the adhesive tape are wound around said dancer roll at a position between said presser roll and said film-and-tape take-up device, and a film pullback spring urging said dancer roll in a direction of retracting movement of said presser roll and having a spring force which is set to allow said film pullback spring to deform into an axially contracted shape by a tension applied to the adhesive tape when said presser roll is advanced by said presser roll actuating device.

5. The film applying apparatus according to claim 4, wherein each of said guide rolls is composed of a tension roll urged by a spring via a pivot arm in such a direction as to pull the laminated film backward, said tension roll said spring and said pivot arm constituting a laminated film tensioning mechanism, and wherein a film tensioning device is disposed to secure engagement with said laminated film tensioning mechanism and engageable with said laminated film tensioning mechanism to force said tension roll in a direction to tension the laminated film by a predetermined distance for at least a part of a time period between initiation of movement of the tacking member in a direction away from the base plate and initiation of pressure-bonding of the laminated film by the lamination rolls after the laminated film is tacked by said tacking member to the leading end of the base plate, with the cover film separated from the laminated film; and wherein said film pullback spring of said adhesive-tape pullback means has a spring constant greater than that of said spring urging said tension roller via said pivot arm.

6. A film applying apparatus of the type wherein a continuous laminated film wound on a film supply roll and composed at least of a base film, a photosensitive layer and a cover film laminated one above another is guided via guide rolls to a leading end of a base plate while being conveyed by a conveying means, then tacked by a tacking member to the leading end of the base plate with the cover film peeled from the photosensitive layer, and thereafter applied to the base plate under pressure by lamination rolls while conveyance of the base plate is further continued, characterized by comprising;

said tacking member having, at its base plate side, a leading end portion including a vertical surface extending along a path of the laminated film, a first beveled surface extending obliquely from a leading end of said vertical surface in a direction away from said path, a second beveled surface extending obliquely from a leading end of said first beveled surface in a direction away from said path, and suction holes formed in said vertical surface, said first beveled surface and said second beveled surface being for holding the laminated film by suction on these surfaces;

a half-cut device disposed upstream of said tacking member and movable in the widthwise direction of the laminated film for cutting the cover film and the photosensitive layer, with the base film left uncut;

an adhesive tape supplying device disposed adjacent to said tacking member for supplying an adhesive tape in a direction having a component in the direction of movement of the laminated film while keeping the adhesive tape in substantially confronted relation to the laminated film;

a presser roll extending in the widthwise direction of the laminated film and rollingly engageable with said first and second beveled surfaces of said leading end portion of said tacking member said presser roll guiding therearound the adhesive tape with its adhesive side facing outward;

a presser roll actuating device rotatably supporting thereon said presser roll and operable to force said presser roll against said leading end portion of said tacking member to cause said presser roll to roll on from said first beveled surface to a leading end of said second beveled surface to thereby force the adhesive tape into adhesion with the cover film, said presser roll actuating device being also operable to move said presser roll in a direction away from the position of said leading end of said second beveled surface;

adhesive-tape pullback means for pulling the adhesive tape in a direction away from said first and second beveled surfaces in synchronism with the movement of said presser roll when said presser roll is moved in a direction away from said second beveled surface;

a film-and-tape take-up device for taking up the adhesive tape and a portion of the cover film bonded to the adhesive tape and separated from the photosensitive layer on the base film as the adhesive tape is pulled in the direction away from said first and second beveled surfaces;

wherein said presser roll actuating device comprises a support shaft disposed in parallel spaced relation to said presser roll, an adjustment frame supported on said support shaft substantially at a longitudinal central portion of the support shaft, a support frame pivotally mounted on said support shaft at a position adjacent to said adjustment frame and pivotally movable about an axis of said support shaft and further extending along and over said support shaft, a pair of linear shafts reciprocally mounted on opposite longitudinal end portions of said support frame and movable toward and away from said first beveled surface and further rotatably supporting at their front end said presser roll, an actuator for reciprocating said linear shafts in the axial direction thereof, and a roll-urging spring disposed between said adjustment frame and said support frame and urging said support frame to move relative to said adjustment frame in a direction to secure pressure contact of said presser roll relative to said first and second beveled surfaces.

7. A film applying apparatus of the type wherein a continuous laminated film wound on a film supply roll and composed at least of a base film, a photosensitive layer and a cover film laminated one above another is guided via guide rolls to a leading end of a base plate while being conveyed by a conveying means then tacked by a tacking member to the leading end of the base plate with the cover film peeled from the photosensitive layer and thereafter applied to the base plate under pressure by lamination rolls while conveyance of the base plate is further continued, characterized by comprising:

said tacking member having, at its base plate side, a leading end portion including a vertical surface extending along a path of the laminated film a first beveled surface extending obliquely from a leading end of said vertical surface in a direction away from said path, a second beveled surface extending obliquely from a leading end of said first beveled surface in a direction away from said path, and suction holes formed in said vertical surface said first beveled surface and said second beveled surface being for holding the laminated film by suction on these surfaces;

wherein said tacking member includes a main vacuum plate having said vertical surface, and a film-tacking member body connected to a leading end, as viewed in the direction of feed of the laminated film, of said main vacuum plate and having said first and second beveled surfaces, said film-tacking member body having a heater embedded therein in the vicinity of a leading end as viewed in the direction of feed of the laminated film, and a fluid passage hole formed in and extending through said main vacuum plate body and disposed in parallel with said vertical surface for the passage therethrough of a cooling fluid.

8. A film applying apparatus according to claim 7, wherein said film-tacking member body has formed therein a second fluid passage hole extending through the film-tacking member body and disposed in parallel with said first and second beveled surfaces for the passage therethrough of said cooling fluid.

9. A film applying apparatus according to claim 7, further including at least one cooling roll disposed on said path of the laminated film adjacent said tacking member and rollingly engageable with the laminated film from the opposite side of said tacking member, said cooling roll having a third fluid passage hole extending longitudinally therethrough for the passage of the cooling fluid.

10. A film applying apparatus according to claim 7, wherein said fluid passage hole and said second fluid passage hole are defined by a pair of stainless steel pipes disposed in and extending through said main vacuum plate and said film-tacking member body, respectively.

* * * * *